US008524421B2

(12) United States Patent
Nozawa et al.

(10) Patent No.: US 8,524,421 B2
(45) Date of Patent: Sep. 3, 2013

(54) MASK BLANK, TRANSFER MASK, METHODS OF MANUFACTURING THE SAME AND METHOD OF MANUFACTURING A SEMICONDUCTOR DEVICE

(75) Inventors: Osamu Nozawa, Tokyo (JP); Hiroaki Shishido, Tokyo (JP); Toshiyuki Suzuki, Tokyo (JP)

(73) Assignee: Hoya Corporation, Tokyo (JP)

( * ) Notice: Subject to any disclaimer, the term of this patent is extended or adjusted under 35 U.S.C. 154(b) by 163 days.

(21) Appl. No.: 13/076,254

(22) Filed: Mar. 30, 2011

(65) Prior Publication Data
US 2011/0244375 A1 Oct. 6, 2011

Related U.S. Application Data

(63) Continuation-in-part of application No. 12/875,783, filed on Sep. 3, 2010.

(30) Foreign Application Priority Data

Mar. 30, 2010 (JP) ................................ 2010-079327
Feb. 24, 2011 (JP) ................................ 2011-037970

(51) Int. Cl.
    *G03F 1/50* (2012.01)
(52) U.S. Cl.
    USPC ............................................................ 430/5
(58) Field of Classification Search
    USPC ...................... 430/5, 322, 323; 428/428, 430
    See application file for complete search history.

(56) References Cited

U.S. PATENT DOCUMENTS

| 6,740,455 | B2 * | 5/2004 | Noguchi et al. ................. 430/5 |
| 7,078,134 | B2 | 7/2006 | Wurm et al. |
| 2007/0020534 | A1 * | 1/2007 | Yoshikawa et al. ............... 430/5 |
| 2007/0212619 | A1 | 9/2007 | Yoshikawa et al. |
| 2009/0214961 | A1 | 8/2009 | Nozawa |
| 2009/0226826 | A1 | 9/2009 | Nozawa |
| 2011/0053057 | A1 | 3/2011 | Nozawa |

FOREIGN PATENT DOCUMENTS

| JP | 57-161857 A | 10/1982 |
| JP | 2006-078825 A | 3/2006 |
| JP | 2007-241060 A | 9/2007 |
| JP | 2008-116583 A | 5/2008 |
| JP | 1020090092725 A | 9/2009 |
| JP | 2010-192503 A | 9/2010 |
| JP | 2011-081356 A | 4/2011 |
| KR | 1020090092725 A | 9/2009 |

OTHER PUBLICATIONS

Japanese Office Action issued Apr. 11, 2012 in related Japanese Patent Application No. 2011-037970.
Korean Office Action corresponding to Korean Patent Application No. 10-2011-0028150, dated Feb. 25, 2013.

* cited by examiner

*Primary Examiner* — Stephen Rosasco
(74) *Attorney, Agent, or Firm* — Sughrue Mion, PLLC

(57) ABSTRACT

In a mask blank for manufacturing a transfer mask, the mask blank has a light-shielding film on a transparent substrate. The light-shielding film is made of a material containing tantalum as a main metal component and includes a highly oxidized layer which has an oxygen content of 60 at % or more and which is formed as a surface layer of the light-shielding film. The highly oxidized layer is placed on a side opposite to a transparent substrate side.

25 Claims, 11 Drawing Sheets

MASK BLANK, TRANSFER MASK, METHODS OF MANUFACTURING THE SAME AND METHOD OF MANUFACTURING A SEMICONDUCTOR DEVICE

This application is a continuation-in-part of U.S. patent application Ser. No. 12/875,783, filed on Sep. 3, 2010, the disclosure of which is incorporated herein in its entirety by reference.

This application is based upon and claims the benefit of priority from Japanese Patent Application No. 2010-079327, filed on Mar. 30, 2010, and Japanese Patent Application No. 2011-037970, filed on Feb. 24, 2011, the disclosures of which are incorporated herein in their entirety by reference.

TECHNICAL FIELD

This invention relates to a mask blank and a transfer mask improved in chemical resistance and light fastness and further to methods of manufacturing them. In particular, this invention relates to a transfer mask to be suitably used in an exposure apparatus using exposure light having a short wavelength of 200 nm or less and further to a mask blank for use in manufacturing such a transfer mask, and further relates to methods of manufacturing them. This invention also relates to a method of manufacturing a semiconductor device by the use of the above-mentioned transfer mask.

BACKGROUND OF THE INVENTION

Generally, fine pattern formation is carried out by photolithography in the manufacture of a semiconductor device. A number of substrates called transfer masks are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by photolithography, use is made of a mask blank having a thin film (e.g. a light-shielding film) for forming a transfer pattern (mask pattern) on a transparent substrate such as a glass substrate. The manufacture of the transfer mask using the mask blank comprises an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing (exposing) the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in photolithography in addition to miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As the transfer mask, there has conventionally been known a binary mask having a light-shielding film pattern made of a chromium-based material on a transparent substrate.

In recent years, there has also appeared a binary mask for ArF excimer laser light using a material (MoSi-based material) containing a molybdenum silicide compound as a light-shielding film. This MoSi-based material may be used as a material of a front-surface antireflection layer formed on a light-shielding layer in a light-shielding film (JP-A-2006-78825 (Patent Document 1)). Patent Document 1 proposes, as a material of the light-shielding layer of the light-shielding film comprising the antireflection layer and the light-shielding layer, a material which is composed mainly of tantalum in terms of etching selectivity to the antireflection layer.

On the other hand, JP-A-S57-161857 (Patent Document 2) discloses a mask blank having a structure in which a tantalum metal layer and a layer of a mixture of tantalum nitride and tantalum oxide are laminated in this order on a transparent substrate.

SUMMARY OF THE INVENTION

In the meantime, since the transfer mask manufacturing cost has been significantly increasing following the pattern miniaturization in recent years, there is an increasing need for a longer lifetime of a transfer mask.

As factors that determine the lifetime of a transfer mask, there are a problem of mask degradation caused by repeated cleaning of the transfer mask (problem of chemical resistance) and a problem of mask degradation caused by cumulative or repetitive irradiation of exposure light on the transfer mask (problem of light fastness).

A light-shielding film made of a MoSi-based material (particularly, for example, a light-shielding film having a front-surface antireflection layer made of MoSiON containing 10 at % or more Mo) has a problem that it cannot be said to be good in chemical resistance such as hot water resistance.

Further, the light-shielding film made of the MoSi-based material has a problem that it cannot be said to be good in light fastness such as ArF irradiation resistance (ArF irradiation fastness).

Conventionally, for example, when haze (foreign substance composed mainly of ammonium sulfide and generated on a mask) is generated, cleaning is carried out for removing the haze, but a film loss (dissolution of film) due to the cleaning cannot be avoided and thus, roughly, the number of times of cleaning determines the mask lifetime.

As described above, the mask lifetime is shortened if the light fastness of the light-shielding film is low, but, so far, the light fastness of the light-shielding film is obtained within the range of the mask lifetime based on the number of times of mask cleaning.

Since the number of times of mask cleaning is reduced due to an improvement to haze in recent years, the period of time of repeated use of a mask is prolonged and thus the exposure time is prolonged correspondingly, and therefore, a problem of light fastness particularly to short-wavelength light such as ArF excimer laser light has been newly actualized. In the case of a tantalum-based material, the chemical resistance and the light fastness are high as compared with the MoSi-based material, but the need is high for a further longer lifetime of a transfer mask and thus higher performance thereof is required. Also in the case of a mask for use with KrF excimer laser as an exposure light, there is a high demand for a further long life and, therefore, a higher resistance against cleaning is required.

This invention has been made under these circumstances and has an object to solve the above-mentioned problems that the light-shielding film made of the MoSi-based material cannot be said to be good in chemical resistance such as hot water resistance and in light fastness such as ArF irradiation resistance, and thus to provide a mask blank and a transfer mask which can ensure excellent chemical resistance and ArF irradiation resistance with a light-shielding film made of a tantalum-based material and further to provide methods of manufacturing such a mask blank and a transfer mask. Another object of this invention is to provide a method of manufacturing a semiconductor device by the use of the above-mentioned transfer mask.

The present inventors have made an intensive study in order to achieve the above-mentioned object.

As a result, the present inventor has found that if a highly oxidized tantalum layer with an oxygen content of 60 at % or more is formed as a surface layer of a light-shielding film made of a tantalum-based material, or as a surface layer of a light-shielding film pattern made of a tantalum-based material and as a surface layer of a sidewall of the pattern, better chemical resistance and ArF irradiation resistance are obtained as compared with a light-shielding film or a light-shielding film pattern made of the tantalum-based material with no such a highly oxidized tantalum layer.

The present inventors have further found out that a film (highly oxidized tantalum layer) with more uniform thickness distribution and with less variation in quality between products can be forcibly formed by applying a later-described predetermined surface treatment (hot water treatment or the like) to a surface of a light-shielding film made of a tantalum-based material, or to a surface of a light-shielding film pattern made of a tantalum-based material and to a surface of a sidewall of the pattern and, as a result, excellent chemical resistance and ArF irradiation resistance are obtained.

Conventionally, with respect to the light-shielding film made of the tantalum-based material, a study has been made about its composition and its multilayer structure, but has hardly been made about a surface layer of the light-shielding film of the tantalum-based material.

As the light-shielding film made of the tantalum-based material, a structure is known in which, for example, a front-surface antireflection layer of TaO is formed on a light-shielding layer of TaN, wherein the oxygen content of the front-surface antireflection layer of TaO is set to 56 to 58 at % for the purpose of enhancing the function of preventing the front-surface reflection. However, a study has hardly been made about a surface layer of the front-surface antireflection layer of TaO.

Under these circumstances, the present inventor has discovered that the light-shielding film made of the tantalum-based material is oxidized not only in the case of Ta alone, but also in the case of TaO or TaN. Specifically, as shown in FIG. 10, it has been discovered that, even in a nitrided tantalum film (particularly a highly nitrogenated tantalum film), almost all nitrogen is replaced by oxygen in a surface layer of the film so that tantalum is oxidized to $Ta_2O_5$. It has also been discovered that oxidation proceeds in a surface layer of a TaO film, resulting in oxidation to $Ta_2O_5$.

Further, it has been discovered that in the case where a surface layer of a tantalum-based material is naturally oxidized, it takes a long time of at least more than a year (e.g. 10,000 hours) for a highly oxidized layer to grow from the surface layer to the inside so as to be stabilized. It is rare to leave a mask blank formed with a light-shielding film in the atmosphere for more than one year and, particularly, it is even more unthinkable that a transfer mask formed with a transfer pattern in a light-shielding film is used after being left in the atmosphere for more than one year without being used for ArF exposure transfer.

It has been discovered that in the case where a surface layer of a tantalum-based material is naturally oxidized, the uniformity in in-plane thickness distribution of a highly oxidized layer and variation in highly oxidized layer thickness between products become large as compared with the case where the later-described predetermined surface treatment according to the present invention is applied.

Particularly, it has been discovered that in the case where a highly oxidized layer is formed at a sidewall of a light-shielding film pattern by natural oxidation in a transfer mask having a light-shielding film comprising at least two layers, i.e. a front-surface antireflection layer and a light-shielding layer, variation in thickness of the highly oxidized layer becomes considerably large between the sidewall of the front-surface antireflection layer made of a material whose oxidation degree in the formation of the layer is relatively high and the sidewall of the light-shielding layer made of a material whose oxidation degree in the formation of the layer is relatively low, as compared with the case where a highly oxidized layer is formed by the later-described predetermined surface treatment.

Further, it has been discovered that a light-shielding film or a light-shielding film pattern of a tantalum-based material formed with a highly oxidized layer as its surface layer is excellent in ArF irradiation resistance.

It has further been discovered that in the case where the later-described predetermined surface treatment is applied, relatively excellent chemical resistance and ArF irradiation resistance are obtained as compared with the case where a highly oxidized tantalum layer with an oxygen content of 60 at % or more (a predetermined highly oxidized tantalum layer) is not formed as a surface layer of a film. The reason for this is that when a chemical treatment with acid, alkali or the like is carried out in the state where the predetermined highly oxidized tantalum layer is not formed as the surface layer, the film may be damaged due to dissolution thereof.

The present inventors have found out the above-mentioned facts and completed this invention.

In this specification, where appropriate, a highly oxidized tantalum layer with an oxygen content of 60 at % or more will be referred to as a "predetermined highly oxidized tantalum layer" while an oxidized tantalum layer with an oxygen content of less than 60 at % will be referred to as a "tantalum oxide layer", thereby distinguishing between the two layers.

In this specification, where appropriate, a surface layer of a light-shielding film made of a tantalum-based material, or a surface layer of a light-shielding film pattern made of a tantalum-based material and a surface layer of a sidewall of the pattern will be referred to as a "predetermined surface layer".

In this invention, a surface layer represents an outermost surface with a depth of about several nm from the surface plane.

This invention has the following structures.

(Structure 1)

A mask blank for manufacturing a transfer mask, the mask blank having a light-shielding film on a transparent substrate, wherein the light-shielding film is made of a material containing tantalum as a main metal component, and a highly oxidized layer with an oxygen content of 60 at % or more is formed as a surface layer of the light-shielding film, that is placed on a side opposite to a transparent substrate side.

(Structure 2)

The mask blank according to the structure 1, wherein the oxygen content of the highly oxidized layer is 68 at % or more.

(Structure 3)

The mask blank according to the structure 1 or 2, wherein the highly oxidized layer has a thickness of 1.5 nm or more and 4 nm or less.

(Structure 4)

The mask blank according to any one of the structures 1 to 3, wherein the highly oxidized layer has $Ta_2O_5$ bonds at an abundance ratio which is higher than that of $Ta_2O_5$ bonds in the light-shielding film except the highly oxidized layer.

(Structure 5)

The mask blank according to any one of the structures 1 to 4, wherein the light-shielding film is made of a material further containing nitrogen.

(Structure 6)

The mask blank according to any one of the structures 1 to 3, wherein the light-shielding film has a structure in which at least a light-shielding layer and a front-surface antireflection layer are laminated in this order from the transparent substrate side, and the highly oxidized layer is formed as a surface layer of the front-surface antireflection layer, that is placed on a side opposite to a light-shielding layer side.

(Structure 7)

The mask blank according to the structure 6, wherein an oxygen content of the front-surface antireflection layer is lower than the oxygen content of the highly oxidized layer.

(Structure 8)

The mask blank according to the structure 7, wherein the oxygen content of the front-surface antireflection layer is 50 at % or more.

(Structure 9)

The mask blank according to any one of the structures 6 to 8, wherein the highly oxidized layer has $Ta_2O_5$ bonds at an abundance ratio which is higher than that of $Ta_2O_5$ bonds in the front-surface antireflection layer.

(Structure 10)

The mask blank according to any one of the structures 6 to 9, wherein the light-shielding layer is made of a material further containing nitrogen.

(Structure 11)

The mask blank according to any one of the structures 1 to 10, wherein the light-shielding film has a thickness of less than 60 nm.

(Structure 12)

A transfer mask having a light-shielding film pattern on a transparent substrate, wherein the light-shielding film pattern is made of a material containing tantalum as a main metal component, and a highly oxidized layer with an oxygen content of 60 at % or more is formed as a surface layer of the light-shielding film pattern, that is placed on a side opposite to a transparent substrate side and as a surface layer of a sidewall of the light-shielding film pattern.

(Structure 13)

The transfer mask according to the structure 12, wherein the oxygen content of the highly oxidized layer is 68 at % or more.

(Structure 14)

The transfer mask according to the structure 12 or 13, wherein the highly oxidized layer has a thickness of 1.5 nm or more and 4 nm or less.

(Structure 15)

The transfer mask according to any one of the structures 12 to 14, wherein the highly oxidized layer has $Ta_2O_5$ bonds at an abundance ratio which is higher than that of $Ta_2O_5$ bonds in the light-shielding film pattern except the highly oxidized layer.

(Structure 16)

The transfer mask according to any one of the structures 12 to 15, wherein the light-shielding film pattern is made of a material further containing nitrogen.

(Structure 17)

The transfer mask according to any one of the structures 12 to 14, wherein the light-shielding film pattern has a structure in which at least a light-shielding layer and a front-surface antireflection layer are laminated in this order from the transparent substrate side.

(Structure 18)

The transfer mask according to the structure 17, wherein an oxygen content of the front-surface antireflection layer is lower than the oxygen content of the highly oxidized layer.

(Structure 19)

The transfer mask according to the structure 18, wherein the oxygen content of the front-surface antireflection layer is 50 at % or more.

(Structure 20)

The transfer mask according to any one of the structures 17 to 19, wherein the highly oxidized layer has $Ta_2O_5$ bonds at an abundance ratio which is higher than that of $Ta_2O_5$ bonds in the front-surface antireflection layer.

(Structure 21)

The transfer mask according to any one of the structures 17 to 20, wherein the light-shielding layer is made of a material further containing nitrogen.

(Structure 22)

The transfer mask according to any one of the structures 12 to 21, wherein the light-shielding film pattern has a thickness of less than 60 nm.

(Structure 23)

A method of manufacturing a transfer mask having a light-shielding film pattern on a transparent substrate, the method comprising:

forming, on the transparent substrate, a light-shielding film made of a material containing tantalum as a main metal component;

etching the light-shielding film to form the light-shielding film pattern; and treating the light-shielding film pattern with hot water or ozone water to form a highly oxidized layer with an oxygen content of 60 at % or more as a surface layer of the light-shielding film pattern.

(Structure 24)

A method of manufacturing a transfer mask having a light-shielding film pattern on a transparent substrate, the method comprising:

forming, on the transparent substrate, a light-shielding film made of a material containing tantalum as a main metal component;

etching the light-shielding film to form the light-shielding film pattern; and heat-treating the light-shielding film pattern in a gas containing oxygen to form a highly oxidized layer with an oxygen content of 60 at % or more as a surface layer of the light-shielding film pattern.

(Structure 25)

A method of manufacturing a transfer mask having a light-shielding film pattern on a transparent substrate, the method comprising:

forming, on the transparent substrate, a light-shielding film made of a material containing tantalum as a main metal component;

etching the light-shielding film to form the light-shielding film pattern; and treating the light-shielding film pattern with ultraviolet light irradiation in a gas containing oxygen to form a highly oxidized layer with an oxygen content of 60 at % or more as a surface layer of the light-shielding film pattern.

(Structure 26)

A method of manufacturing a transfer mask having a light-shielding film pattern on a transparent substrate, the method comprising:

forming, on the transparent substrate, a light-shielding film made of a material containing tantalum as a main metal component;

etching the light-shielding film to form the light-shielding film pattern; and surface-treating the light-shielding film pattern with oxygen plasma to form a highly oxidized layer with an oxygen content of 60 at % or more as a surface layer of the light-shielding film pattern.

(Structure 27)

A method of manufacturing a transfer mask having a light-shielding film pattern on a transparent substrate, the method comprising:

forming, on the transparent substrate, a light-shielding film made of a material containing tantalum as a main metal component;

etching the light-shielding film to form the light-shielding film pattern; and forming a highly oxidized layer with an oxygen content of 60 at % or more on a surface of the light-shielding film pattern by sputtering.

(Structure 28)

The method of manufacturing a transfer mask according to any one of the structures 23 to 27, wherein the highly oxidized layer has $Ta_2O_5$ bonds at an abundance ratio which is higher than that of $Ta_2O_5$ bonds in the light-shielding film pattern except the highly oxidized layer.

(Structure 29)

A method of manufacturing a semiconductor device, comprising forming a circuit pattern on a semiconductor wafer by the use of the transfer mask according to any one of the structures 12 to 22.

(Structure 30)

A method of manufacturing a semiconductor device, comprising forming a circuit pattern on a semiconductor wafer by the use of the transfer mask prepared by the transfer mask manufacturing method according to any one of the structures 23 to 28.

(Structure 31)

A mask blank which is used for manufacturing a transfer mask and which has a light-shielding film on a transparent substrate, wherein the light-shielding film is made of a material containing tantalum as a main metal component;

a highly oxidized layer is formed as a surface layer of the light-shielding film and is placed on a side opposite to a transparent substrate side; and the highly oxidized layer has $Ta_2O_5$ bonds at an abundance ratio which is higher than that of $Ta_2O_5$ bonds in the light-shielding film except the highly oxidized layer.

(Structure 32)

A transfer mask having a light-shielding film pattern on a transparent substrate, wherein:

the light-shielding film pattern is made of a material containing tantalum as a main metal component;

a highly oxidized layer is formed as a surface layer of the light-shielding film pattern on a side opposite to a transparent substrate side and as a surface layer of a side wall of the light-shielding film pattern; and the highly oxidized layer has $Ta_2O_5$ bonds at an abundance ratio which is higher than that of $Ta_2O_5$ bonds in the light-shielding film pattern except the highly oxidized layer.

According to this invention, the following effects are obtained.

(1) Since a highly oxidized tantalum layer with an oxygen content of 60 at % or more (a predetermined highly oxidized tantalum layer) is formed as a surface layer of a light-shielding film made of a tantalum-based material (a predetermined surface layer), or as a surface layer of a light-shielding film pattern made of a tantalum-based material and as a surface layer of a sidewall of the pattern (a predetermined surface layer), not only the chemical resistance such as hot water resistance is significantly improved as compared with a MoSi-based light-shielding film, but also the chemical resistance is improved even as compared with a light-shielding film of the tantalum-based material formed with no such a highly oxidized layer.

In the state where a predetermined highly oxidized tantalum layer is not formed as a predetermined surface layer, it may happen that a light-shielding film or a light-shielding film pattern is damaged due to an acid treatment, an alkali treatment, or the like. This damage cannot be recovered.

(2) In the state where natural oxidation of a surface layer of a tantalum-based material has proceeded due to being left in the atmosphere for a long time (more than one year), the chemical resistance is improved as compared with the case where no such a surface layer is formed. However, the uniformity in thickness distribution of the oxidized layer formed at the surface of a light-shielding film or a light-shielding film pattern decreases as compared with the case where a highly oxidized tantalum layer is forcibly formed by a surface treatment. Further, even when mask blanks manufactured in the same lot are naturally oxidized in the same environment, variation in thickness of highly oxidized tantalum layers in light-shielding films tends to occur among the mask blanks. Since detection of the thickness of the highly oxidized tantalum layer cannot be easily carried out, it is difficult to perform 100% inspection. That is, it is difficult to stably manufacture mask blanks having an appropriate highly oxidized tantalum layer by natural oxidation. On the other hand, in the case where a highly oxidized tantalum layer is formed by the later-described predetermined surface treatment, the uniformity in thickness distribution of the highly oxidized tantalum layer is easily obtained and, further, the uniformity in thickness of highly oxidized tantalum layers in mask blank products is also high. Accordingly, it is possible to stably supply mask blanks having a predetermined highly oxidized tantalum layer.

(3) In a transfer mask, in the state where natural oxidation of a surface layer of a tantalum-based light-shielding film pattern and a surface layer of a sidewall of the pattern has proceeded, the thickness distribution of the oxidized layer particularly on the sidewall side tends to be nonuniform, resulting in the occurrence of portions with low ArF irradiation resistance. On the other hand, in the case where the later-described predetermined surface treatment is applied after forming a tantalum-based light-shielding film pattern, a predetermined highly oxidized tantalum layer with highly uniform thickness distribution is formed as a surface layer of the pattern and a surface layer of a sidewall of the pattern so that it is possible to provide high ArF irradiation resistance over the entire light-shielding film pattern.

(4) A highly oxidized tantalum layer with an oxygen content of 60 at % or more has higher resistance to Cl-based gas etching as compared with a tantalum oxide layer (TaO layer) with an oxygen content of less than 60 at % and, therefore, when dry-etching a TaN layer or the like using the TaO layer as a mask, the resistance as the etching mask is improved as compared with the case where there is no highly oxidized tantalum layer with an oxygen content of 60 at % or more. Thus, it is possible to reduce rounding of a pattern edge portion of the tantalum oxide layer (front-surface antireflection layer).

(5) In the case where, as in later-described Structure 6, a front-surface antireflection layer is not entirely formed by a highly oxidized tantalum layer, but only a surface layer thereof is formed by a highly oxidized tantalum layer, the front-surface antireflection layer is allowed to have a certain optical density for ArF exposure light, thus contributing to a reduction in thickness of a light-shielding film.

DESCRIPTION OF THE INVENTION

Figure 1:
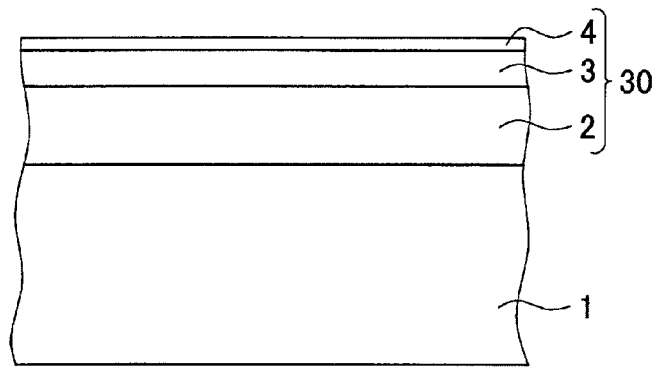
FIG. 1 is a cross-sectional view showing the structure of a mask blank according to an embodiment of this invention.

This invention will be described in detail hereinbelow.

A mask blank according to this invention is for manufacturing a transfer mask and is characterized by having a light-shielding film on a transparent substrate, wherein the light-shielding film is made of a material containing tantalum as a main metal component, and a highly oxidized layer with an oxygen content of 60 at % or more is formed as a surface layer of the light-shielding film, that is placed on a side opposite to a transparent substrate side (Structure 1).

A transfer mask according to this invention is characterized by having a light-shielding film pattern on a transparent substrate, wherein the light-shielding film pattern is made of a material containing tantalum as a main metal component, and a highly oxidized layer with an oxygen content of 60 at % or more is formed as a surface layer of the light-shielding film pattern, that is placed on a side opposite to a transparent substrate side and as a surface layer of a sidewall of the light-shielding film pattern (Structure 12).

In this invention, the surface layer on the side opposite to the transparent substrate side represents a layer including a surface located on the side opposite to the transparent substrate side and having a certain depth from this surface.

The invention according to the Structure 1 or 12 is an invention based on the finding that excellent chemical resistance and ArF irradiation resistance are obtained by forming a highly oxidized tantalum layer with an oxygen content of 60 at % or more (a predetermined highly oxidized tantalum layer) as a surface layer of a light-shielding film made of a material containing tantalum as a main metal component (hereinafter referred to as a "tantalum-based material") (a predetermined surface layer), or as a surface layer of a light-shielding film pattern made of a tantalum-based material and as a surface layer of a sidewall of the pattern (a predetermined surface layer).

In this invention, it is considered that the bonding state of TaO being a relatively unstable oxidation state is predominant in a "tantalum oxide layer" formed as a predetermined surface layer when its oxygen content is less than 60 at %. The oxidation degree of TaO is the lowest among oxides of tantalum so that a TaO layer is not regarded as a "highly oxidized layer" referred to in this invention.

A tantalum oxide layer with an oxygen content of less than 60 at % is formed as a front-surface antireflection layer. In this event, the oxygen content is, for example, 50 at % or more (e.g. 56 to 58 at %).

It is desirable that the crystal structure of a light-shielding film of a mask blank or a transfer mask be microcrystalline, preferably amorphous. This also applies to the light-shielding film of this invention. Accordingly, the crystal structure of the light-shielding film hardly becomes a single structure and tends to be in a state where a plurality of crystal structures are mixed. That is, in the case of a highly oxidized tantalum layer, it tends to be in a state where TaO bonds, $Ta_2O_3$ bonds, $TaO_2$ bonds, and $Ta_2O_5$ bonds are mixed. As the ratio of $Ta_2O_5$ bonds increases in a predetermined surface layer of the light-shielding film, the chemical resistance and the ArF irradiation resistance increase while as the ratio of TaO bonds increases, the chemical resistance and the ArF irradiation resistance decrease.

In this invention, it is considered that, in the predetermined highly oxidized tantalum layer, when its oxygen content is 60 at % or more and less than 66.7 at %, $Ta_2O_3$ bonds tend to be predominant in the bonding states of tantalum and oxygen so that the most unstable TaO bonds significantly decrease as compared with the case where the oxygen content is less than 60 at %.

In this invention, it is considered that, in the predetermined highly oxidized tantalum layer, when its oxygen content is 66.7 at % or more, $TaO_2$ bonds tend to be predominant in the bonding states of tantalum and oxygen so that the most unstable TaO bonds and the next most unstable $Ta_2O_3$ bonds significantly decrease.

In the predetermined highly oxidized tantalum layer, when its oxygen content is 60 at % or more, not only the most stable state of "$Ta_2O_5$", but also the bonding states of "$Ta_2O_3$" and "$TaO_2$" are contained. However, it is considered that, at least, the content of the most unstable TaO bonds reaches a lower limit value, i.e. a value small enough not to cause a reduction in chemical resistance or ArF irradiation resistance.

In this invention, it is considered that, in the predetermined highly oxidized tantalum layer, when its oxygen content is 68 at % or more (Structures 2, 13), not only $Ta_2O_5$ bonds become predominant, but also the ratio (namely, presence or abundance ratio) of the bonding state of $Ta_2O_5$ increases. With such an oxygen content, the bonding states of "$Ta_2O_3$" and "$TaO_2$" are rarely present and the bonding state of "TaO" cannot be present. In this invention, it is preferable that the highly oxidized layer has $Ta_2O_5$ bonds at an abundance ratio which is higher than that of $Ta_2O_5$ bonds in the light-shielding film or the light-shielding film pattern except the highly oxidized layer (Structures 4, 15). Since $Ta_2O_5$ bonds form a very stable bonding state, a mask cleaning resistance, such as chemical resistance and hot water resistance, and ArF irradiation resistance are considerably improved by increasing the abundance ratio of $Ta_2O_5$ bonds in the highly oxidized layer.

In this invention, it is considered that the predetermined highly oxidized tantalum layer is formed substantially only by the bonding state of $Ta_2O_5$ when its oxygen content is 71.4 at %.

In this invention, the predetermined highly oxidized tantalum layer is most preferably formed only by the bonding state of $Ta_2O_5$.

In this invention, when the predetermined highly oxidized tantalum layer is formed only by the bonding state of $Ta_2O_5$, it is preferable that the predetermined highly oxidized tantalum layer substantially consists of tantalum and oxygen. This is because the predetermined highly oxidized tantalum layer is preferably formed substantially only by the bonding state of $Ta_2O_5$ and the like.

When the predetermined highly oxidized tantalum layer is substantially formed of tantalum and oxygen, it is preferable that nitrogen or another element is contained within a range that does not affect the function and effect of this invention and is not substantially contained.

In this invention, as a method of forming the highly oxidized tantalum layer with the oxygen content of 60 at % or more (the predetermined highly oxidized tantalum layer), use may be made of a hot water treatment, an ozone-containing water treatment, a heat treatment in a gas containing oxygen, an ultraviolet light irradiation treatment in a gas containing oxygen, an $O_2$ plasma treatment, or the like.

In this invention, the light-shielding film may have a single-layer structure or a plural-layer structure.

The light-shielding film may comprise an antireflection layer.

The light-shielding film may be a composition gradient film.

The light-shielding film may have a two-layer structure in which a light-shielding layer and a front-surface antireflection layer are laminated in this order from the transparent substrate side.

The light-shielding film may have a three-layer structure in which a back-surface antireflection layer, a light-shielding layer, and a front-surface antireflection layer are laminated in this order from the transparent substrate side.

In this invention, the material containing tantalum as the main metal component and forming the light-shielding film may be, for example, tantalum (Ta) alone, tantalum containing nitrogen (TaN), tantalum containing oxygen (TaO), tantalum containing nitrogen and oxygen (TaON), tantalum containing boron (TaB), tantalum containing nitrogen and boron (TaBN), tantalum containing oxygen and boron (TaBO), a composite material of them, or the like. In addition, carbon (C) may be added to a group of the above-mentioned materials.

In this invention, the highly oxidized tantalum layer with the oxygen content of 60 at % or more (the predetermined highly oxidized tantalum layer) preferably has a thickness of 1.5 nm or more and 4 nm or less (Structure 3, 14).

If the thickness is less than 1.5 nm, it is too thin to expect the effect while if the thickness exceeds 4 nm, it largely affects the front-surface reflectance, thus making it difficult to perform control for obtaining a predetermined front-surface reflectance (reflectance for ArF exposure light or reflectance spectrum for lights with respective wavelengths). Further, since the highly oxidized tantalum layer is very low in optical density for ArF exposure light, the optical density that can be obtained by the front-surface antireflection layer is reduced, thus adversely affecting in terms of reducing the thickness of the light-shielding film.

In the case where the highly oxidized tantalum layer is formed by applying a later-described predetermined surface treatment immediately after forming the light-shielding film or in a state of no natural oxidation after forming the light-shielding film, the thickness of the highly oxidized tantalum layer tends to be in the range of 1.5 nm to 4 nm. If the thickness is in this range, sufficient chemical resistance and ArF irradiation resistance are obtained. Taking into account the balance between the viewpoint of ensuring the optical density of the entire light-shielding film and the viewpoint of improving the chemical resistance and the ArF irradiation resistance, the thickness of the highly oxidized tantalum layer is more preferably set to 1.5 nm or more and 3 nm or less.

According to an aspect of this invention, the light-shielding film or the light-shielding film pattern is made of a material further containing nitrogen (Structure 5 or 16).

This structure is advantageous in terms of preventing the back-surface reflection and, since a back-surface antireflection layer for preventing the back-surface reflection does not need to be formed between the transparent substrate and the light-shielding layer, it is advantageous also in terms of ensuring the light-shielding performance with a relatively small thickness.

In another aspect of this invention, the light-shielding film has a structure in which at least a light-shielding layer and a front-surface antireflection layer are laminated in this order from the transparent substrate side, and the highly oxidized layer is formed as a surface layer of the front-surface antireflection layer, that is placed on a side opposite to a light-shielding layer side (Structure 6).

In another aspect of this invention, the light-shielding film pattern may have a structure in which at least a light-shielding layer and a front-surface antireflection layer are laminated in this order from the transparent substrate side (Structure 17).

This structure is advantageous in terms of preventing the front-surface reflection and, by forming the light-shielding layer of a material with high light-shielding performance, it is advantageous also in terms of ensuring the light-shielding performance with a relatively small thickness.

In this invention, it is preferable that an oxygen content of the front-surface antireflection layer is lower than the oxygen content of the highly oxidized layer (Structure 7, 18).

This structure is advantageous in terms of obtaining a predetermined front-surface reflectance with a smaller thickness.

In this invention, the oxygen content of the front-surface antireflection layer is preferably less than 60 at %.

In this invention, it is preferable that the oxygen content of the front-surface antireflection layer is 50 at % or more (Structure 8, 19).

This structure is advantageous in terms of enhancing (maximizing) the effect of preventing the front-surface reflection. Further, when the front-surface antireflection layer is used as an etching mask (hard mask) in dry etching of the light-shielding layer using a chlorine-based gas, the etching resistance to the chlorine-based gas increases so that higher etching selectivity can be ensured. In the case where the front-surface antireflection layer further contains nitrogen, the total content of nitrogen and oxygen is preferably 50 at % or more and, even if the oxygen content falls below 50 at %, the effect of preventing the front-surface reflection can still be enhanced.

In terms of enhancing (maximizing) the effect of preventing the front-surface reflection, it is preferable that, for example, the oxygen content of the front-surface antireflection layer be set to 56 to 58 at % and the highly oxidized tantalum layer with the oxygen content of 60 at % or more be formed as a surface layer of the front-surface antireflection layer.

In Structures 6 to 8 and 17 to 19, It is preferable that the highly oxidized layer has $Ta_2O_5$ bonds at an abundance ratio which is higher than that of $Ta_2O_5$ bonds in the front-surface antireflection layer (Structures 9, 20).

Since the $Ta_2O_5$ bonds are an extremely stable bonding state, the mask cleaning resistance, such as the chemical resistance and the hot water resistance, and the ArF irradiation resistance are remarkably improved by increasing the abundance ratio of $Ta_2O_5$ bonds in the highly oxidized layer.

In the above-mentioned Structures 6 to 9, Structures 17 to 20, it is preferable that the light-shielding layer is made of a material further containing nitrogen (Structure 10, 21).

This structure is advantageous in terms of preventing the back-surface reflection and also in terms of ensuring the light-shielding performance of the light-shielding film with a relatively small thickness.

It is preferable that the light-shielding film or the light-shielding film pattern has a thickness of less than 60 nm (Structure 11, 22).

These structures are advantageous in terms of transferring a finer pattern.

Particularly for a transfer mask for use in the hyper-NA exposure (immersion exposure) generation, it is necessary to perform mask pattern correction such as OPC (optical proximity correction) or SRAF (sub-resolution assist feature). In order to reduce calculation load of a simulation necessary for such correction, it is effective to reduce the thickness of a mask pattern and this can be satisfied by the above-mentioned structure.

The present inventor has elucidated that a first treatment after forming a light-shielding film or after forming a light-shielding film pattern by etching the light-shielding film largely affects the chemical resistance and the ArF irradiation resistance and thus is important (Structures 23 to 26).

The present inventor has discovered that if the first treatment is not appropriate, the light-shielding film or the light-shielding film pattern may be damaged. For example, it has been discovered that if the first treatment is a treatment using an alkaline solution such as an aqueous solution containing ammonia and hydrogen peroxide, the light-shielding film or the light-shielding film pattern may be damaged (particularly, if a TaN layer is included, the TaN layer is damaged). Further, it has been discovered that, for example, in the case where the light-shielding film contains boron, if the first treatment is an acid treatment using a sulfuric acid hydrogen peroxide mixture, hot concentrated sulfuric acid, or the like, the light-shielding film or the light-shielding film pattern may be damaged.

The present inventor has discovered that one or more of a hot water treatment, an ozone-containing water treatment, a heat treatment in a gas containing oxygen, an ultraviolet light irradiation treatment in a gas containing oxygen, and a surface treatment with oxygen plasma are suitable as the first treatment.

A uniform and strong film (highly oxidized tantalum layer) can be forcibly formed by applying the above-mentioned predetermined surface treatment and, as a result, excellent chemical resistance and ArF irradiation resistance are obtained.

The above-mentioned predetermined surface treatment can also serve as a cleaning treatment.

Since it has been elucidated that a highly oxidized tantalum layer of a predetermined thickness can be formed as a surface layer of the light-shielding film pattern by applying the above-mentioned predetermined surface treatment, confirmation by analysis is not required in the case where the above-mentioned predetermined surface treatment is applied. On the other hand, in the case of natural oxidation, the progress of the oxidation is largely affected by an environment in which a substrate formed with a light-shielding film pattern is left, and thus it is difficult to control the thickness of a surface layer of the light-shielding film pattern. Currently, there is no particular method for detecting the thickness of a highly oxidized tantalum layer in a short time and with no destruction and thus it is difficult to perform 100% inspection. Further, in the case of natural oxidation, more than one year (e.g. 10,000 hours) is required so that difficulty arises also in terms of the production management.

A method of manufacturing a transfer mask according to this invention is for manufacturing a transfer mask having a light-shielding film pattern on a transparent substrate, and is characterized by comprising:

forming, on the transparent substrate, a light-shielding film made of a material containing tantalum as a main metal component;

etching the light-shielding film to form a light-shielding film pattern; and treating the light-shielding film pattern with hot water or ozone water to form a highly oxidized layer with an oxygen content of 60 at % or more as a surface layer of the light-shielding film pattern (Structure 23).

The treatment with the hot water preferably uses pure water or ultrapure water such as deionized water (DI water).

The temperature of the hot water is preferably about 70 to 90° C.

The treatment time with the hot water is preferably about 10 to 120 minutes.

The treatment with the ozone water preferably uses 40 to 60 ppm ozone-containing water.

The temperature of the ozone-containing water is preferably about 15 to 30° C.

The treatment time with the ozone-containing water is preferably about 10 to 20 minutes.

A method of manufacturing a transfer mask according to this invention is for manufacturing a transfer mask having a light-shielding film pattern on a transparent substrate, and is characterized by comprising:

forming, on the transparent substrate, a light-shielding film made of a material containing tantalum as a main metal component;

etching the light-shielding film to form a light-shielding film pattern; and heat-treating the light-shielding film pattern in a gas containing oxygen to form a highly oxidized layer with an oxygen content of 60 at % or more as a surface layer of the light-shielding film pattern (Structure 24).

The temperature of the heat treatment is preferably about 120 to 280° C.

The treatment time of the heat treatment is preferably about 5 to 30 minutes.

As the gas containing oxygen, use may be made of the atmosphere, an atmosphere with an oxygen concentration higher than that of the atmosphere, or the like.

A method of manufacturing a transfer mask according to this invention is for manufacturing a transfer mask having a light-shielding film pattern on a transparent substrate, and is characterized by comprising:

forming, on the transparent substrate, a light-shielding film made of a material containing tantalum as a main metal component;

etching the light-shielding film to form a light-shielding film pattern; and treating the light-shielding film pattern with ultraviolet light irradiation in a gas containing oxygen to form a highly oxidized layer with an oxygen content of 60 at % or more as a surface layer of the light-shielding film pattern (Structure 25).

Ultraviolet light for use in the ultraviolet light irradiation treatment may have any wavelength as long as it can produce ozone from oxygen contained in the gas (the atmosphere) around a surface of the light-shielding film pattern. Monochromatic short-wavelength ultraviolet light such as KrF excimer laser light, ArF excimer laser light, $Xe_2$ excimer laser light or $Xe_2$ excimer light is preferable because it can efficiently produce ozone from ambient oxygen and minimize the heat generation of the light-shielding film irradiated with the ultraviolet light.

In the case of the excimer laser light, the irradiation range is narrow due to the properties thereof so that it is necessary to scan the surface of the light-shielding film pattern. Therefore, the irradiation time of the ultraviolet light irradiation treatment cannot be unconditionally specified, but is, for example, preferably about 15 to 30 minutes. On the other hand, in the case of ultraviolet light irradiation using an ultrahigh pressure mercury lamp, the irradiation time is preferably about 1 to 10 minutes.

The gas containing oxygen may be an atmospheric state or an atmosphere with an oxygen concentration higher than that of the atmospheric state, or the like.

A method of manufacturing a transfer mask according to this invention is for manufacturing a transfer mask having a light-shielding film pattern on a transparent substrate, and is characterized by method comprising:

forming, on the transparent substrate, a light-shielding film made of a material containing tantalum as a main metal component;

etching the light-shielding film to form a light-shielding film pattern; and surface-treating the light-shielding film pattern with oxygen plasma to form a highly oxidized layer with an oxygen content of 60 at % or more as a surface layer of the light-shielding film pattern (Structure 26).

The treatment time with the oxygen plasma is preferably about 1 to 10 minutes.

A method of manufacturing a transfer mask according to this invention is for manufacturing a transfer mask having a light-shielding film pattern on a transparent substrate, and is characterized by comprising:

forming, on the transparent substrate, a light-shielding film made of a material containing tantalum as a main metal component;

etching the light-shielding film to form a light-shielding film pattern; and forming a highly oxidized layer with an oxygen content of 60 at % or more on a surface of the light-shielding film pattern by sputtering (Structure 27).

In this invention, when Ta is used as a target, a tantalum film with an oxygen content of 60 at % or more is difficult to form by a low defect by DC magnetron sputtering, and it is preferable to use RF magnetron sputtering or ion beam sputtering.

Particularly, in the case of forming a predetermined surface layer using a $Ta_2O_5$ target, the film formation is difficult by DC magnetron sputtering because $Ta_2O_5$ has no conductivity, and it is necessary to use RF magnetron sputtering or ion beam sputtering.

Even in the case of forming a predetermined surface layer by RF magnetron sputtering or ion beam sputtering using a $Ta_2O_5$ target, the surface layer may be subjected to oxygen deficiency (bonding state other than $Ta_2O_5$ bonding state is present) in an atmosphere of only a noble gas as a film forming gas introduced into a sputtering chamber. In order to avoid this, it is preferable that the surface layer be formed by introducing, as a film forming gas, a mixed gas of a noble gas and oxygen into the sputtering chamber.

In Structures 23 to 27, it is preferable that the highly oxidized layer has $Ta_2O_5$ bonds at an abundance ratio which is higher than that of $Ta_2O_5$ bonds in the front-surface antireflection layer (Structure 28).

This is because, since the $Ta_2O_5$ bonds are an extremely stable bonding state, the mask cleaning resistance, such as the chemical resistance and the hot water resistance, and the ArF irradiation resistance are considerably improved by increasing the abundance ratio of $Ta_2O_5$ bonds in the highly oxidized layer.

According to Structures 1 to 32, mask cleaning resistance, such as chemical resistance and hot water resistance, and ArF irradiation fastness are considerably improved. Therefore, the invention described in Structures 1 to 32 is particularly suitable to a transfer mask and a mask blank adapted to exposure light having a wavelength of 200 nm or less.

According to Structures 1 to 32, mask cleaning resistance, such as chemical resistance and hot water resistance, is considerably improved. Therefore, the invention described in Structures 1 to 32 is particularly suitable to a transfer mask and a mask blank adapted to KrF excimer laser exposure light (having a wavelength of 248 nm).

In this invention, sputtering is preferably used as a method of forming the light-shielding film, but this invention is not limited thereto.

A DC magnetron sputtering apparatus is preferably used as a sputtering apparatus, but this invention is not limited to this film forming apparatus. Another type of sputtering apparatus such as a RF magnetron sputtering apparatus may alternatively be used.

In this invention, dry etching effective for forming a fine pattern is preferably used as the above-mentioned etching.

In this invention, use can be made of, for example, a fluorine-based gas such as $SF_6$, $CF_4$, $C_2F_6$, or $CHF_3$ in dry etching of a tantalum-based material containing oxygen (tantalum oxide layer, highly oxidized tantalum layer, or the like).

In this invention, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$, or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, the transparent substrate is not particularly limited as long as it has transparency with respect to an exposure wavelength to be used. In this invention, a synthetic quartz substrate, a quartz substrate, and various other glass substrates (e.g. $CaF_2$ substrate, soda-lime glass substrate, aluminosilicate glass substrate, alkali-free glass substrate, low thermal expansion glass substrate, etc.) can be used and, among them, the synthetic quartz substrate is particularly suitable for this invention because it has high transparency in the range of ArF excimer laser light or shorter-wavelength light.

A method of manufacturing a semiconductor device according to this invention is featured by forming a circuit pattern on a semiconductor wafer by using the transfer mask mentioned in any one of the structures or the transfer mask manufactured by the method mentioned in any one of the structures (Structures 29, 30).

The light-shield film pattern of the transfer mask according to this invention is excellent in the hot water resistance, the chemical resistance, and so on and also in the ArF irradiation resistance. Therefore, decrease of a line width during mask cleaning is small and an increase of the line width due to irradiation of the ArF excimer laser is small. Accordingly, it is possible to transfer a fine pattern (for example, a circuit pattern of DRAM hp45 nm) onto a resist film on a semiconductor wafer with high accuracy. Consequently, the fine pattern can be formed on the semiconductor wafer with high accuracy by using a resist pattern which is formed by exposure transfer using the transfer mask according to this invention.

A mask blank according to this invention is used for manufacturing the transfer mask and comprises a light-shielding film on a transparent substrate, wherein:

the light-shielding film is made of a material containing tantalum as a main metal component;

a highly oxidized layer is formed as a surface layer of the light-shielding film and is placed on a side opposite to a transparent substrate side; and the highly oxidized layer has $Ta_2O_5$ bonds at an abundance ratio which is higher than that of $Ta_2O_5$ bonds in the light-shielding film except the highly oxidized layer (Structure 31).

A transfer mask according to this invention has a light-shielding film pattern on a transparent substrate and is featured in that:

the light-shielding film pattern is made of a material containing tantalum as a main metal component;

a highly oxidized layer is formed as a surface layer of the light-shielding film pattern on a side opposite to a transparent substrate side and as a surface layer of a side wall of the light-shielding film pattern; and the highly oxidized layer has $Ta_2O_5$ bonds at an abundance ratio which is higher than that of $Ta_2O_5$ bonds in the light-shielding film pattern except the highly oxidized layer (Structure 32).

The light-shielding film and the light-shielding film pattern of the mask blank and the transfer mask mentioned above are excellent in the chemical resistance, the hot water resistance, and the ArF irradiation resistance because the highly oxidized layer which has a high abundance ratio of $Ta_2O_5$ bonds is formed as the surface layer.

DESCRIPTION OF THE EXEMPLARY EMBODIMENTS

Figure 2:
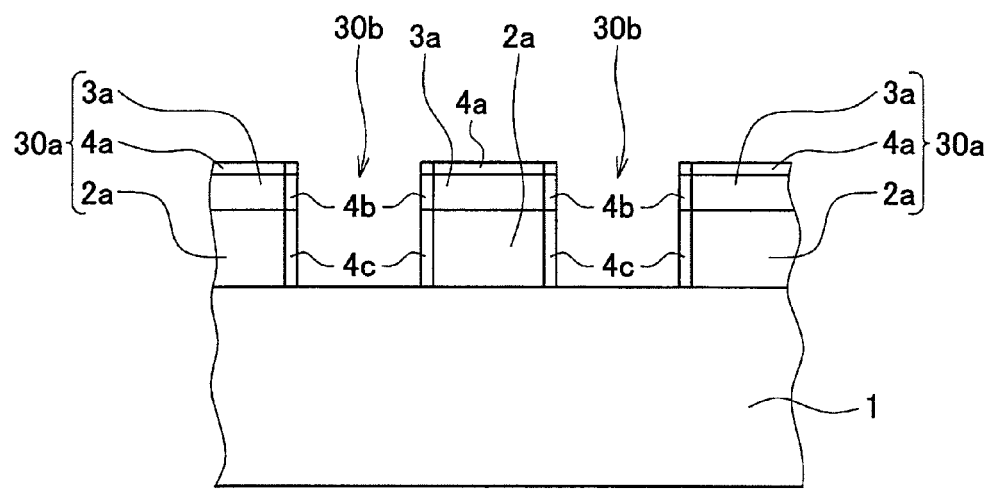
FIG. 2 is a cross-sectional view showing the structure of a transfer mask according to the embodiment of this invention.
Figure 3:
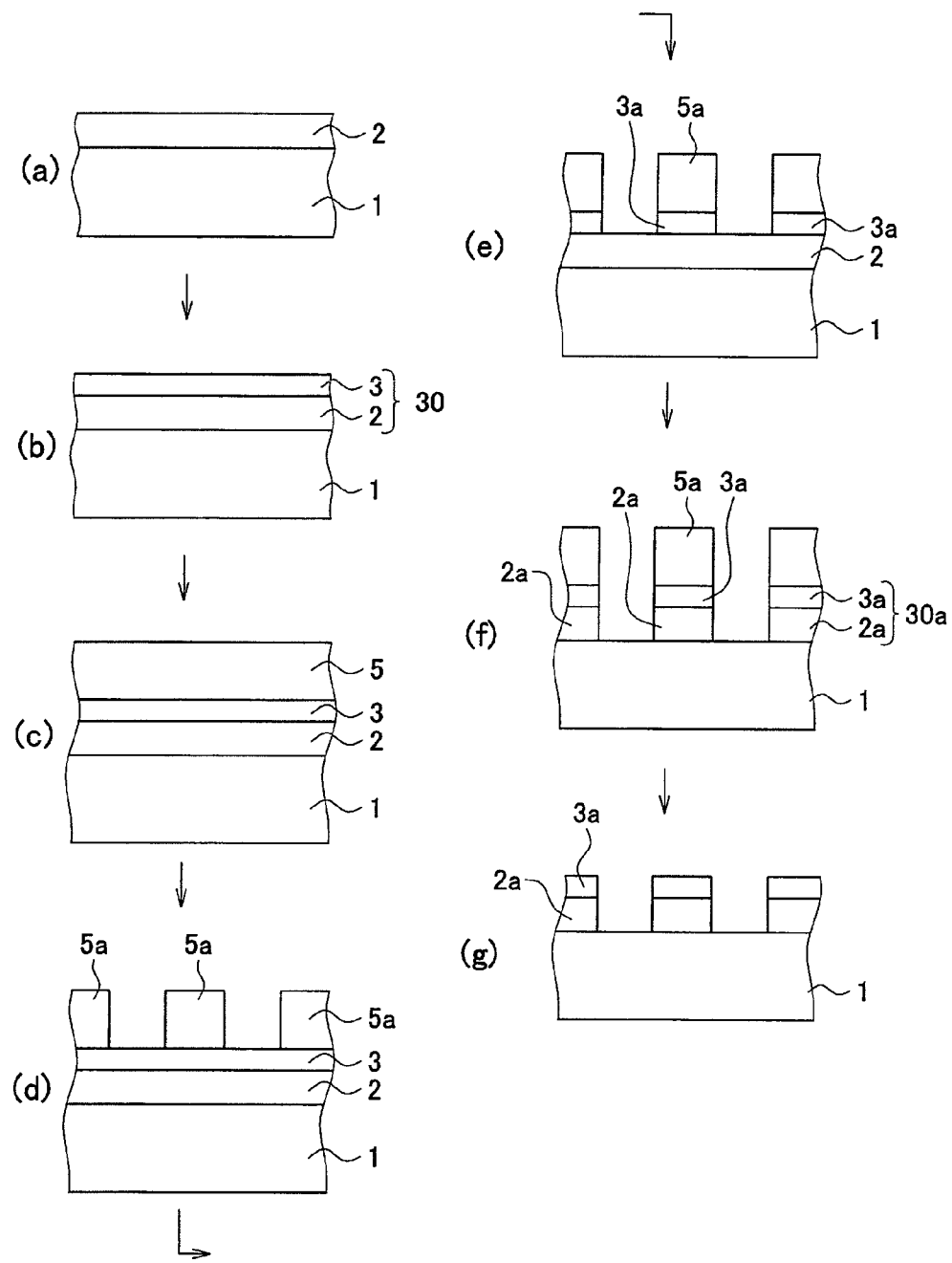
FIG. 3 shows cross-sectional views (a) to (g) for describing processes of manufacturing a mask blank and a transfer mask according to the embodiment of this invention.

FIG. 1 is a cross-sectional view showing the structure of a mask blank according to an embodiment of this invention, FIG. 2 is a cross-sectional view showing the structure of a transfer mask according to the embodiment of this invention, and FIG. 3 is a cross-sectional view showing processes of manufacturing a mask blank and a transfer mask according to the embodiment of this invention. Hereinbelow, referring to these figures, the mask blank and the transfer mask according to the embodiment of this invention will be described.

As shown in FIG. 1, the mask blank according to this embodiment is configured such that a Ta nitride layer (light-shielding layer) 2 composed mainly of Ta nitride and having a thickness of 42 nm is formed on a glass substrate 1 made of synthetic quartz, a Ta oxide layer (front-surface antireflection layer) 3 composed mainly of Ta oxide and having a thickness of 9 nm is formed on the Ta nitride layer 2, and a highly oxidized tantalum layer 4 is formed as a surface layer of the Ta oxide layer 3. The Ta nitride layer 2, the Ta oxide layer 3, and the highly oxidized tantalum layer 4 form a light-shielding film 30. The nitrogen (N) content of the Ta nitride layer 2 is 16 at %, the oxygen (O) content of the Ta oxide layer 3 is 58 at %, and the oxygen (O) content of the highly oxidized tantalum layer 4 is 71.4 at %.

As shown in FIG. 2, the transfer mask according to this embodiment is configured such that, by patterning the light-shielding film 30 of the mask blank shown in FIG. 1, a fine pattern comprising a portion 30a where the light-shielding film 30 is left remaining and a portion 30b where the light-shielding film 30 is removed is formed on the glass substrate 1.

A highly oxidized tantalum layer 4a is formed as a surface layer of the light-shielding film pattern 30a. Further, at a sidewall of the light-shielding film pattern 30a, a highly oxidized tantalum layer 4b is formed as a surface layer of a sidewall of a pattern 3a of the Ta oxide layer 3 and a highly oxidized tantalum layer 4c is formed as a surface layer of a sidewall of a pattern 2a of the Ta nitride layer 2.

Referring now to FIG. 3, a description will be given of Examples of manufacturing the mask blank and the transfer mask according to this embodiment.

Example 1

Manufacture of Mask Blank

Hot Water Treatment

A substrate 1 made of synthetic quartz and having a size of about 152 mm×152 mm square and a thickness of 6.35 mm was introduced into a DC magnetron sputtering apparatus. After the inside of the sputtering apparatus was evacuated to $2\times10^{-5}$ (Pa) or less, a mixed gas of Ar and $N_2$ was introduced into the sputtering apparatus. In this event, the flow rate of Ar and the flow rate of $N_2$ were adjusted to 38.5 sccm and 9 sccm, respectively. Ta was used as a sputtering target. After the gas flow rates were stabilized, the power of a DC power supply was set to 1.5 kW, thereby forming a Ta nitride layer 2 having a thickness of 42 nm on the substrate 1 (see FIG. 3, (*a*)).

Then, while the substrate 1 formed with the Ta nitride layer 2 was maintained in the sputtering apparatus, a mixed gas containing an Ar gas at a flow rate of 58 sccm and an $O_2$ gas at a flow rate of 32.5 sccm was introduced into the sputtering apparatus and then the power of the DC power supply was set to 0.7 kW, thereby stacking a Ta oxide layer 3 having a thickness of 9 nm on the Ta nitride layer 2 (see FIG. 3, (*b*)). When forming the Ta oxide layer 3 by DC magnetron sputtering, it may happen that an oxide film is deposited on the sputtering target to reduce the film forming rate. For suppressing the reduction in film forming rate, a DC pulse unit is effective. In this Example, use was made of Sparc-LEV (trade name) manufactured by Advanced Energy Industries, Inc.

The reflectance (front-surface reflectance) of a surface, remote from the substrate 1, of a light-shielding film 30 thus formed was 25.2% for ArF exposure light (wavelength: 193 nm). The reflectance (back-surface reflectance) of a surface, where the light-shielding film 30 was not formed, of the substrate 1 was 38.2% for ArF exposure light. Further, the transmittance for ArF exposure light was 0.1%.

Values of refractive index n and extinction coefficient k were calculated using n&k 1280 (trade name), an optical thin-film property measuring apparatus, manufactured by n&k Technology, Inc. As a result, the refractive index n and the extinction coefficient k of the Ta nitride layer 2 were 2.00 and 2.22, respectively, and the refractive index n and the extinction coefficient k of the Ta oxide layer 3 were 2.23 and 1.09, respectively.

Further, analysis by AES (Auger electron spectroscopy) was performed for a light-shielding film 30 formed in the same manner. As a result, the nitrogen (N) content of the Ta nitride layer 2 was 16 at % and the oxygen (O) content of the Ta oxide layer 3 was 58 at %. At this point of time, the formation of a highly oxidized tantalum layer 4 was not confirmed.

Further, the surface roughness in a 1 μm square area of the light-shielding film 30 was measured using AFM (atomic force microscope) and, as a result, the surface roughness Rms was 0.29 nm.

Further, defect inspection was conducted using M1350 (trade name), a defect inspection apparatus, manufactured by Lasertec Corporation and it was confirmed that it was possible to identify defects normally.

Before natural oxidation proceeded (e.g. within one hour after the film formation) or after being kept in an environment where natural oxidation did not proceed, a mask blank thus manufactured was immersed in deionized water (DI water) at 90° C. for 120 minutes, thereby carrying out a hot water treatment (surface treatment).

In this manner, a mask blank of Example 1 was obtained.

Figure 9:
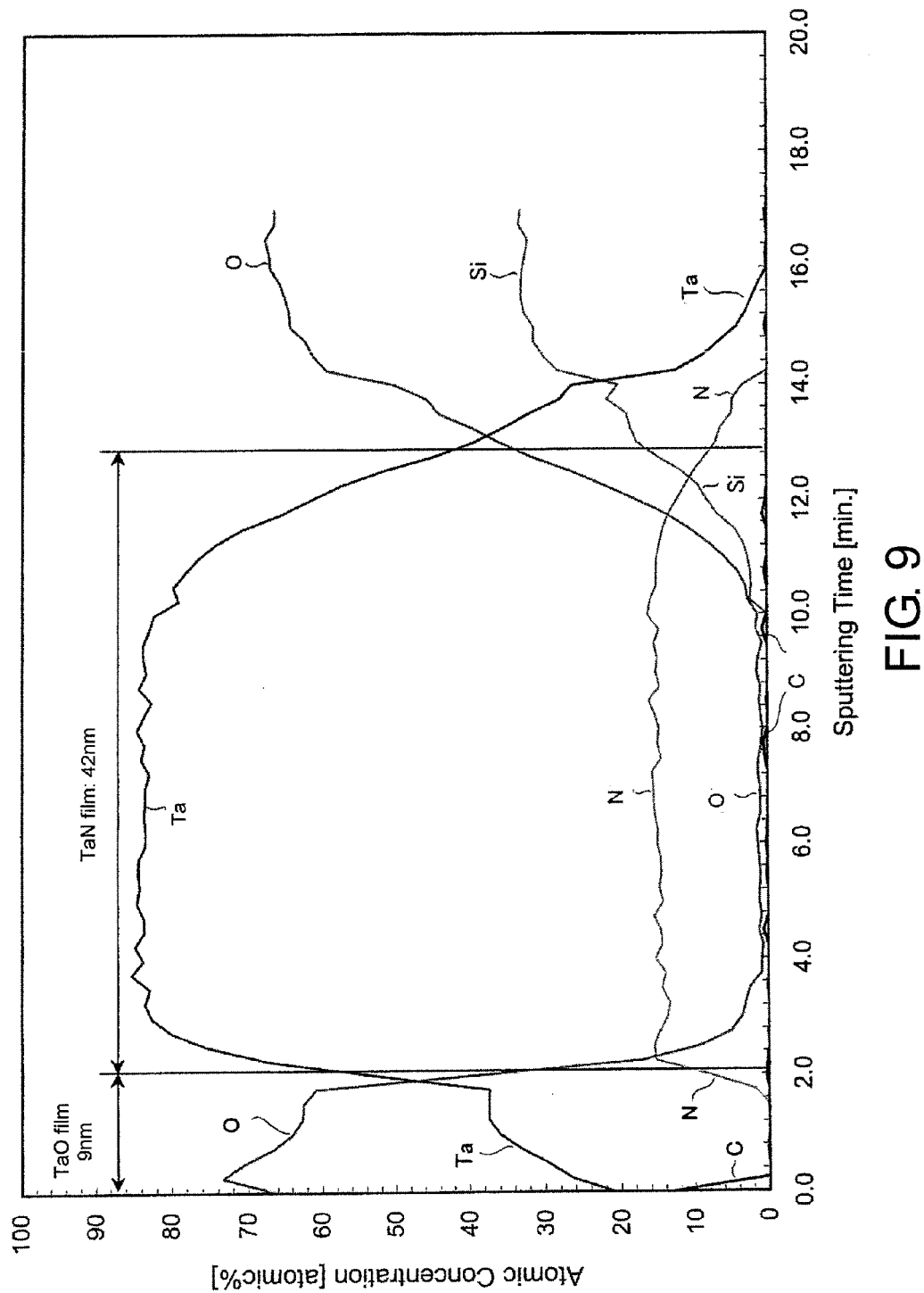
FIG. 9 is a diagram showing the results (depth profile) of analyzing a light-shielding film comprising a TaO antireflection layer and a TaN light-shielding layer by AES (Auger electron spectroscopy) after a predetermined surface treatment.
Figure 10:
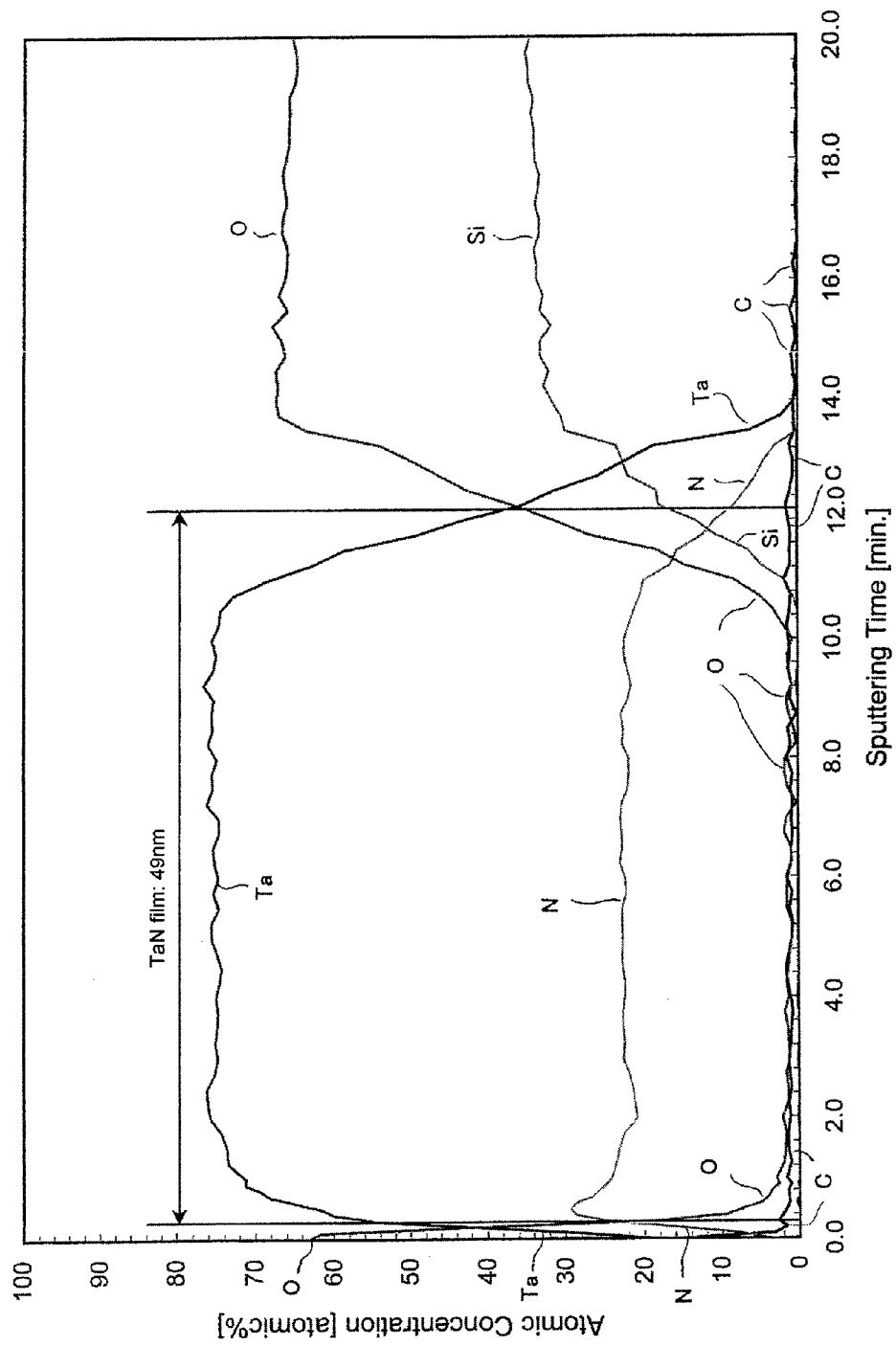
FIG. 10 is a diagram showing the results (depth profile) of analyzing a highly nitrogenated tantalum film by AES.

In the mask blank of Example 1, the formation of a highly oxidized tantalum layer 4 was confirmed at a surface layer of the light-shielding film 30. Specifically, the highly oxidized tantalum layer ($Ta_2O_5$ layer) 4 having a thickness of 2 nm was confirmed by a depth profile of the light-shielding film in AES analysis results as shown in FIG. 9. The oxygen (O) content of this layer 4 was 71.4 to 67 at %.

In the mask blank of Example 1, the reflectance (front-surface reflectance) of a surface, remote from the substrate 1, of the light-shielding film 30 was 25.1% for ArF exposure light (wavelength: 193 nm) and thus a change was small with respect to the front-surface reflectance before the surface treatment. The reflectance (back-surface reflectance) of a surface, where the light-shielding film 30 was not formed, of the substrate 1 was 38.2% for ArF exposure light and thus was the same as that before the surface treatment. Further, the transmittance for ArF exposure light was 0.1% and thus was the same as that before the surface treatment.

Further, the surface roughness in a 1 μm square area of the light-shielding film 30 was measured using AFM. As a result, the surface roughness Rms was 0.29 nm and thus was the same as that before the surface treatment.

Further, defect inspection was conducted using M1350 (trade name) manufactured by Lasertec Corporation and it was confirmed that it was possible to identify defects normally.

Figure 8:
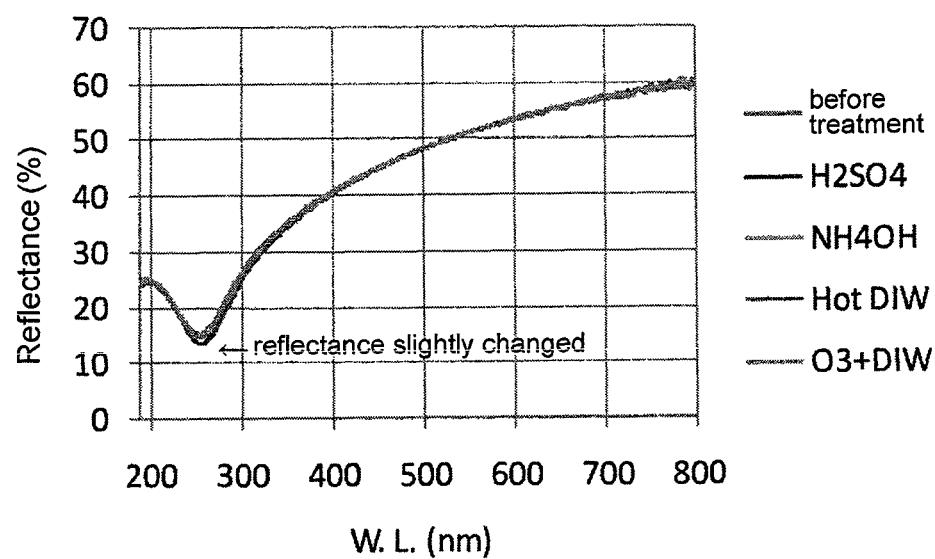
FIG. 8 is a diagram showing the results of comparing the reflectance (front-surface reflectance) spectra with each other before and after a predetermined surface treatment.

As shown in FIG. 8, the reflectance (front-surface reflectance) spectra before and after the hot water treatment were compared with each other. As a result, the reflectance was slightly lowered (about 0.5% to 1%) around 250 nm. It is thus conjectured that it is possible to change the properties (e.g. improve the stoichiometry) of the highly oxidized tantalum layer 4 by the hot water treatment.

Reference Example 1

Mask Blank is Left in the Atmosphere

A light-shielding film 30 was formed in the same manner as in Example 1. Then, before natural oxidation proceeded (e.g. within one hour after the film formation) or after being kept in an environment where natural oxidation did not proceed, a mask blank was left in an environment at 25° C. and 40% RH for 1,000 hours (about 42 days), thereby causing natural oxidation to proceed.

In this manner, a mask blank of Reference Example 1 was obtained.

In the mask blank of Reference Example 1, the formation of a highly oxidized tantalum layer 4 was confirmed at a surface layer of the light-shielding film 30. Specifically, the highly oxidized tantalum layer 4 having a thickness of 1 nm was confirmed by a depth profile of the light-shielding film in AES analysis results. This layer 4 was analyzed by AES and, as a result, the oxygen (O) content changed from 71.4 at % to 59 at % from the side opposite to the transparent substrate side toward the light-shielding layer side, thus forming a composition gradient structure.

(Evaluation of Mask Blank)

There were prepared a plurality of mask blanks of Example 1, a plurality of mask blanks of Reference Example 1, and a plurality of mask blanks (Comparative Example 1) immediately after the film formation of a light-shielding film 30 in the same manner as in Example 1, i.e. not having been subjected to a forcible oxidation treatment such as a hot water treatment or natural oxidation. Then, the chemical resistance of these mask blanks was verified. The verification was performed by an acid treatment and an alkali treatment which were widely used in mask cleaning or the like. In the acid treatment, a solution of [sulfuric acid ($H_2SO_4$, concentration 98 wt %):hydrogen peroxide ($H_2O_2$, concentration 30 wt %)=4:1 (volume ratio)] was heated to 90° C. and used. The treatment time was set to 30 minutes. In the alkali treatment, a solution of [ammonium hydroxide ($NH_4OH$, concentration 25 wt %):hydrogen peroxide ($H_2O_2$, concentration 30 wt %):water ($H_2O$)=2:1:4

(volume ratio)] was used at room temperature (23° C.). The treatment time was set to 30 minutes.

As a result, with respect to the light-shielding film 30 of the mask blank of Comparative Example 1, a film loss of a little less than 0.2 nm was confirmed as a result of the acid treatment while a film loss of about 0.3 nm was confirmed as a result of the alkali treatment. With respect to the light-shielding film 30 of the mask blank of Reference Example 1, a film loss of a little less than 0.2 nm was confirmed as a result of the acid treatment while a film loss of a little less than 0.3 nm was confirmed as a result of the alkali treatment. Thus, there was almost no effect with the highly oxidized tantalum layer 4 having a composition gradient structure with insufficient oxidation and having a thickness of as small as about 1 nm. On the other hand, with respect to the light-shielding film 30 of the mask blank of Example 1, no film loss was confirmed (below the lower detection limit) as a result of either of the chemical treatments, i.e. the acid treatment and the alkali treatment. Thus, it was seen that the highly oxidized tantalum layer 4 largely contributed to the improvement in chemical resistance.

Example 2

Manufacture of Transfer Mask

Hot Water Treatment

A light-shielding film 30 was formed in the same manner as in Example 1. Then, a transfer mask of Example 2 was manufactured using a mask blank before natural oxidation proceeded (e.g. within one hour after the film formation) or after being kept in an environment where natural oxidation did not proceed.

First, an electron beam resist 5 was coated to a thickness of 150 nm (see FIG. 3, (c)) and then electron beam writing and development were carried out, thereby forming a resist pattern 5a (see FIG. 3, (d)).

Then, dry etching using a fluorine-based (CHF$_3$) gas was carried out, thereby forming a pattern 3a of a Ta oxide layer 3 (see FIG. 3, (e)). Then, dry etching using a chlorine-based (Cl$_2$) gas was carried out, thereby forming a pattern 2a of a Ta nitride layer 2. Further, 30% additional etching was carried out, thereby forming a light-shielding film pattern 30a on a substrate 1 (see FIG. 3, (f)).

SEM cross-section observation was carried out for the light-shielding film pattern 30a thus formed. As a result, the electron beam resist remained with a thickness of about 80 nm.

Then, the resist on the light-shielding film pattern 30a was removed, thereby obtaining the light-shielding film pattern 30a as a transfer pattern (see FIG. 3, (g)).

In this manner, a transfer mask (binary mask) was obtained.

Before natural oxidation proceeded (e.g. within one hour after the transfer pattern formation) or after being kept in an environment where natural oxidation did not proceed, the transfer mask thus manufactured was immersed in deionized water (DI water) at 90° C. for 120 minutes, thereby carrying out a hot water treatment (surface treatment).

In this manner, a transfer mask of Example 2 was obtained.

In the transfer mask of Example 2, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of 3 nm were confirmed by cross-section observation using STEM (scanning transmission electron microscope). AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of the Ta oxide layer 3 was 71.4 to 67 at %. On the other hand, it is difficult to confirm the oxygen content at a pattern sidewall portion by AES analysis. Therefore, EDX (energy dispersive X-ray spectroscopy) analysis was used at the time of the observation by STEM to make comparison with the results of the preceding AES analysis on the highly oxidized tantalum layer 4a as the surface layer of the light-shielding film pattern 30a. As a result, it was confirmed that the oxygen contents of the highly oxidized tantalum layers 4b and 4c were each equal to that of the highly oxidized tantalum layer 4a.

Example 3

Manufacture of Transfer Mask

Ozone Treatment

A transfer mask was obtained by forming a light-shielding film pattern 30a in a light-shielding film 30 of a mask blank of Example 1 in the same manner as in Example 2. Then, before natural oxidation proceeded (e.g. within one hour after the transfer pattern formation) or after being kept in an environment where natural oxidation did not proceed, the transfer mask not having been subjected to a hot water treatment was subjected to an ozone treatment, thereby manufacturing a transfer mask of Example 3.

The ozone treatment (surface treatment) was carried out using ozone-containing water with an ozone concentration of 50 ppm and at a temperature of 25° C. The treatment time was set to 15 minutes.

In this manner, the transfer mask of Example 3 was obtained.

In the transfer mask of Example 3, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of 3 nm were confirmed by cross-section observation using STEM. AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of a Ta oxide layer 3 was 71.4 to 67 at %. On the other hand, it is difficult to confirm the oxygen content at a pattern sidewall portion by AES analysis. Therefore, EDX analysis was used at the time of the observation by STEM to make comparison with the results of the preceding AES analysis on the highly oxidized tantalum layer 4a as the surface layer of the light-shielding film pattern 30a. As a result, it was confirmed that the oxygen contents of the highly oxidized tantalum layers 4b and 4c were each equal to that of the highly oxidized tantalum layer 4a.

Example 4

Manufacture of Transfer Mask

Heat Treatment

A transfer mask was obtained by forming a light-shielding film pattern 30a in a light-shielding film 30 of a mask blank of Example 1 in the same manner as in Example 2. Then, before natural oxidation proceeded (e.g. within one hour after the transfer pattern formation) or after being kept in an environment where natural oxidation did not proceed, the transfer mask not having been subjected to a hot water treatment was subjected to a heat treatment, thereby manufacturing a transfer mask of Example 4.

The heat treatment (surface treatment) was carried out at a heating temperature of 140° C. in the atmosphere for a treatment time of 30 minutes.

In this manner, the transfer mask of Example 4 was obtained.

In the transfer mask of Example 4, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of 3 nm were confirmed by cross-section observation using STEM. AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of a Ta oxide layer 3 was 71.4 to 67 at %. On the other hand, it is difficult to confirm the oxygen content at a pattern sidewall portion by AES analysis. Therefore, EDX analysis was used at the time of the observation by STEM to make comparison with the results of the preceding AES analysis on the highly oxidized tantalum layer 4a as the surface layer of the light-shielding film pattern 30a. As a result, it was confirmed that the oxygen contents of the highly oxidized tantalum layers 4b and 4c were each equal to that of the highly oxidized tantalum layer 4a.

Example 5

Manufacture of Transfer Mask

UV Light Irradiation Treatment

A transfer mask was obtained by forming a light-shielding film pattern 30a in a light-shielding film 30 of a mask blank of Example 1 in the same manner as in Example 2. Then, before natural oxidation proceeded (e.g. within one hour after the transfer pattern formation) or after being kept in an environment where natural oxidation did not proceed, the transfer mask not having been subjected to a hot water treatment was subjected to an ultraviolet light irradiation treatment, thereby manufacturing a transfer mask of Example 5.

The ultraviolet light irradiation treatment (surface treatment) was carried out by scanning 50 mJ/cm$^2$ ArF excimer laser light at a scanning speed of 1 cm/sec over the entire surface of the light-shielding film pattern 30a.

In this manner, the transfer mask of Example 5 was obtained.

In the transfer mask of Example 5, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of 3 nm were confirmed by cross-section observation using STEM. AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of a Ta oxide layer 3 was 71.4 to 67 at %. On the other hand, it is difficult to confirm the oxygen content at a pattern sidewall portion by AES analysis. Therefore, EDX analysis was used at the time of the observation by STEM to make comparison with the results of the preceding AES analysis on the highly oxidized tantalum layer 4a as the surface layer of the light-shielding film pattern 30a. As a result, it was confirmed that the oxygen contents of the highly oxidized tantalum layers 4b and 4c were each equal to that of the highly oxidized tantalum layer 4a.

Example 6

Manufacture of Transfer Mask

Oxygen Plasma Treatment

A transfer mask was obtained by forming a light-shielding film pattern 30a in a light-shielding film 30 of a mask blank of Example 1 in the same manner as in Example 2. Then, before natural oxidation proceeded (e.g. within one hour after the transfer pattern formation) or after being kept in an environment where natural oxidation did not proceed, the transfer mask not having been subjected to a hot water treatment was subjected to an oxygen plasma treatment, thereby manufacturing a transfer mask of Example 6.

The oxygen plasma treatment (surface treatment) was carried out by introducing the transfer mask into a resist stripping apparatus adapted to perform oxygen plasma ashing. The treatment time was set to 5 minutes.

In this manner, the transfer mask of Example 6 was obtained.

In the transfer mask of Example 6, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of 3 nm were confirmed by cross-section observation using STEM. AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of a Ta oxide layer 3 was 71.4 to 67 at %. On the other hand, it is difficult to confirm the oxygen content at a pattern sidewall portion by AES analysis. Therefore, EDX analysis was used at the time of the observation by STEM to make comparison with the results of the preceding AES analysis on the highly oxidized tantalum layer 4a as the surface layer of the light-shielding film pattern 30a. As a result, it was confirmed that the oxygen contents of the highly oxidized tantalum layers 4b and 4c were each equal to that of the highly oxidized tantalum layer 4a.

Reference Example 2

Transfer Mask is Left in the Atmosphere

A transfer mask was obtained by forming a light-shielding film pattern 30a in a light-shielding film 30 of a mask blank of Example 1 in the same manner as in Example 2. Then, before natural oxidation proceeded (e.g. within one hour after the transfer pattern formation) or after being kept in an environment where natural oxidation did not proceed, the transfer mask not having been subjected to a hot water treatment was subjected to natural oxidation, thereby manufacturing a transfer mask of Reference Example 2.

Specifically, the transfer mask was left in an environment at 25° C. and 40% RH for 1,000 hours (about 42 days), thereby causing natural oxidation to proceed.

In this manner, the transfer mask of Reference Example 2 was obtained.

In the transfer mask of Reference Example 2, the formation of highly oxidized tantalum layers 4a, 4b, and 4c was confirmed at a surface layer of the light-shielding film pattern 30a. Specifically, the highly oxidized tantalum layers 4a, 4b, and 4c each having a thickness of about 1 nm were confirmed by cross-section observation using STEM. AES analysis was also performed at a portion, where the light-shielding film was present, of the light-shielding film pattern 30a. Based on a depth profile of the light-shielding film in AES analysis results, it was confirmed that the oxygen (O) content of the highly oxidized tantalum layer 4a as a surface layer of a Ta oxide layer 3 changed from 71.4 at % to 59 at % from the side opposite to the transparent substrate side toward the light-shielding layer side, thus forming a composition gradient structure.

(Evaluation of Transfer Mask)

There were prepared a plurality of transfer masks of each of Examples 2 to 6 and Reference Example 2 and a plurality of transfer masks (Comparative Example 2) each of which was obtained by forming a light-shielding film pattern 30a in a light-shielding film 30 of a mask blank of Example 1 in the same manner as in Example 2, each of which was in a state before natural oxidation proceeded (e.g. within one hour after the transfer pattern formation) or after being kept in an environment where natural oxidation did not proceed, and each of which was not subjected to a hot water treatment. Then, the chemical resistance of these transfer masks was verified. The verification was performed by an acid treatment and an alkali treatment which were widely used in mask cleaning or the like. In the acid treatment, a solution of [sulfuric acid ($H_2SO_4$, concentration 98 wt %):hydrogen peroxide ($H_2O_2$, concentration 30 wt %)=4:1 (volume ratio)] was heated to 90° C. and used. The treatment time was set to 30 minutes. In the alkali treatment, a solution of [ammonium hydroxide ($NH_4OH$, concentration 25 wt %):hydrogen peroxide ($H_2O_2$, concentration 30 wt %):water ($H_2O$)=2:1:4 (volume ratio)] was used at room temperature (23° C.). The treatment time was set to 30 minutes.

As a result, with respect to the light-shielding film pattern 30a of the transfer mask of Comparative Example 2, a film loss of a little less than 0.2 nm was confirmed as a result of the acid treatment while a film loss of about 0.3 nm was confirmed as a result of the alkali treatment. With respect to the light-shielding film pattern 30a of the transfer mask of Reference Example 2, a film loss of a little less than 0.2 nm was confirmed as a result of the acid treatment while a film loss of a little less than 0.3 nm was confirmed as a result of the alkali treatment. Thus, there was almost no effect with the highly oxidized tantalum layers 4a, 4b, and 4c having a composition gradient structure with insufficient oxidation and having a thickness of as small as about 1 nm. On the other hand, with respect to the light-shielding film patterns 30a of the transfer masks of Examples 2 to 6, no film loss was confirmed (below the lower detection limit) as a result of either of the chemical treatments, i.e. the acid treatment and the alkali treatment. Thus, it was seen that the highly oxidized tantalum layers 4a, 4b, and 4c largely contributed to the improvement in chemical resistance.

Then, likewise, there were prepared transfer masks of Examples 2 to 6, Reference Example 2, and Comparative Example 2. Then, ArF excimer laser light (wavelength: 193 nm) with a pulse frequency of 300 Hz and a pulse energy of 16 mJ/$cm^2$/pulse was continuously irradiated so that the cumulative dose became 30 kJ/$cm^2$. Herein, the dose of 30 kJ/$cm^2$ corresponds to a dose which is received by a transfer mask when exposing/transferring a transfer pattern to resist films of 112,500 wafers.

In the case of the transfer masks manufactured in Examples 2 to 6, i.e. in the case where the hot water treatment, the ozone treatment, the heat treatment in a gas containing oxygen, the ultraviolet light irradiation treatment in a gas containing oxygen, and the surface treatment with oxygen plasma were applied to the transfer patterns, respectively, before natural oxidation of the transfer patterns proceeded (e.g. within one hour after the transfer pattern formation) or after being kept in an environment where natural oxidation of the transfer patterns did not proceed, ArF irradiation resistance, which will be described with reference to FIGS. 4 and 5 and FIGS. 6 and 7, was obtained.

Figure 4:
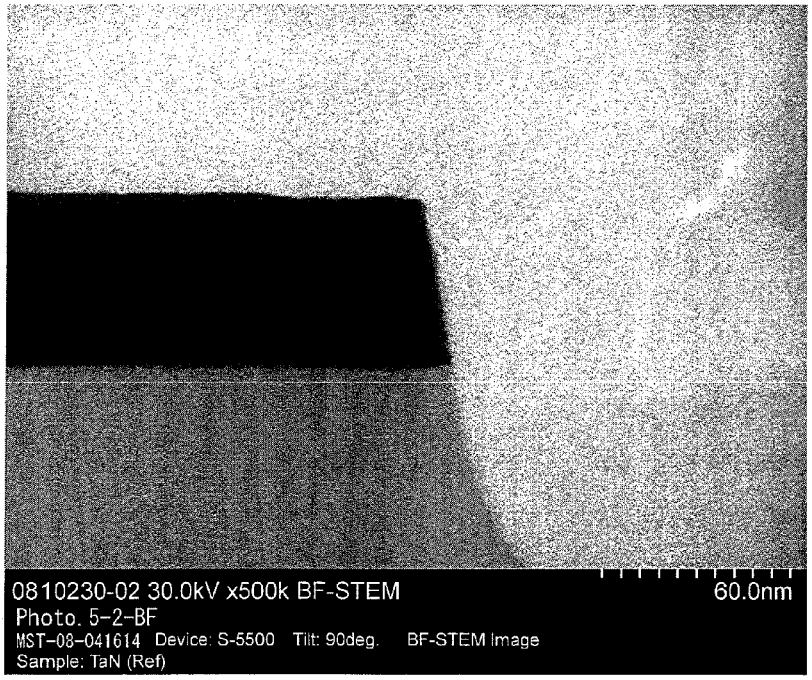
FIG. 4 is a bright-field (BF) STEM image showing a state, observed before ArF irradiation, of a cross-section of a transfer pattern in a transfer mask manufactured in Example 2.
Figure 5:
FIG. 5 is a bright-field (BF) STEM image showing a state, observed after ArF irradiation, of a cross-section of a transfer pattern in a transfer mask manufactured in Example 2.
Figure 6:
FIG. 6 is a dark-field (DF) STEM image showing a state, observed before ArF irradiation, of a cross-section of a transfer pattern in a transfer mask manufactured in Example 2.
Figure 7:
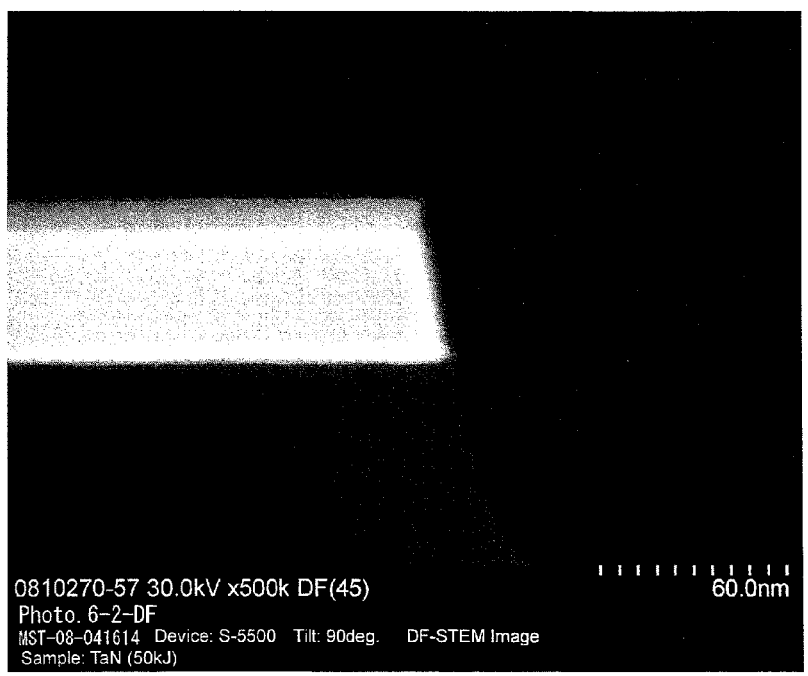
FIG. 7 is a dark-field (DF) STEM image showing a state, observed after ArF irradiation, of a cross-section of a transfer pattern in a transfer mask manufactured in Example 2.

FIGS. 4 and 5 and FIGS. 6 and 7 are STEM photographs showing states, observed before and after ArF irradiation, of cross-sections of the transfer patterns in the transfer masks manufactured in Example 2. FIGS. 4 and 5 are each a bright-field (BF) STEM image (magnification: ×500,000) which is formed using electron beams transmitted through the sample, wherein FIG. 4 shows a cross-section of the transfer mask irradiated with no ArF excimer laser light while FIG. 5 shows a cross-section of the transfer mask irradiated with 30 kJ/$cm^2$ of ArF excimer laser light in a 50% RH environment. FIGS. 6 and 7 are each a dark-field (DF) STEM image (magnification: ×500,000) which is formed using electron beams scattered from the sample and which enables observation of a composition image in which the contrast reflecting the composition of the sample is obtained. FIG. 6 shows a cross-section of the transfer mask irradiated with no ArF excimer laser light and is the dark-field STEM image of the same transfer mask as FIG. 4. FIG. 7 shows a cross-section of the transfer mask irradiated with 30 kJ/$cm^2$ of ArF excimer laser light in a 50% RH environment and is the dark-field STEM image of the same transfer mask as FIG. 5.

In the bright-field STEM images of FIGS. 4 and 5, a portion close to black is the light-shielding film pattern 30a and an underlying pattern of a lighter color than the light-shielding film pattern 30a is the transparent substrate 1. In order to better observe the shape of the sidewall of the light-shielding film pattern 30a, the transparent substrate 1 is intentionally dug down by etching. In the dark-field images of FIGS. 6 and 7, the pattern 3a of the Ta oxide layer 3 and the pattern 2a of the Ta nitride layer 2 of the light-shielding film pattern 30a can be better observed visually. As shown in FIGS. 4 and 5 and FIGS. 6 and 7, in comparison with the ArF non-irradiation state (reference) of FIGS. 4 and 6, no difference (degradation such as increase in line width, change in surface layer of the antireflection layer, or change in optical density) was observed after the irradiation with 30 kJ/$cm^2$ of ArF excimer laser light in FIGS. 5 and 7. The same verification was performed for the transfer masks of Examples 3 to 6 and the results were as good as Example 2. The same verification was performed also for the transfer masks of Comparative Example 2 and Reference Example 2 and the results were not so good as Examples 2 to 6.

As described above, it is seen that the transfer masks (binary masks) and the mask blanks (binary mask blanks) of the Examples have extremely high light fastness to cumulative irradiation of exposure light having a short wavelength of 200 nm or less.

Comparative Example 3

MoSi-Based Light-Shielding Film

On a substrate 1 made of synthetic quartz and having a size of about 152 mm×152 mm square and a thickness of 6.35 mm, a MoSiN film (light-shielding layer) 2 and a MoSiON film (front-surface antireflection layer) 3 were formed in this order as a light-shielding film 30 using a DC magnetron sputtering apparatus (see FIGS. 3, (a) and (b) which are used for the sake of description).

Specifically, using a mixed target of Mo and Si (Mo:Si=21 at %:79 at %), a film comprising molybdenum, silicon, and nitrogen (Mo:9 at %, Si:72.8 at %, N:18.2 at %) was formed to a thickness of 52 nm in an Ar gas atmosphere, thereby forming the MoSiN film (light-shielding layer) 2.

Then, using a mixed target of Mo:Si=12 mol %:88 mol %, a film comprising molybdenum, silicon, oxygen, and nitrogen (Mo:7.4 at %, Si:52.3 at %, 0:16.1 at %, N:24.2 at %) was formed to a thickness of 8 nm in a mixed gas atmosphere of Ar, $O_2$, and $N_2$, thereby forming the MoSiON film (front-surface antireflection layer) 3.

The total thickness of the light-shielding film 30 was 60 nm. The optical density (OD) of the light-shielding film 30 was 3.0 at the wavelength 193 nm of ArF excimer laser exposure light.

In this manner, a binary mask blank of Comparative Example 3 was manufactured.

Then, a binary mask was manufactured using this binary mask blank.

First, a chemically amplified positive resist film 5 for electron beam writing (PRL009 manufactured by FUJIFILM Electronic Materials Co., Ltd.) was formed on the mask blank (see FIG. 3, (c)).

Then, using an electron beam writing apparatus, a required pattern was written on the resist film 5 formed on the mask blank and, thereafter, the resist film 5 was developed with a predetermined developer, thereby forming a resist pattern 5a (see FIG. 3, (d)).

Then, using the resist pattern 5a as a mask, the two-layer structure light-shielding film 30 comprising the MoSiN film (light-shielding layer) 2 and the MoSiON film (front-surface antireflection layer) 3 was dry-etched, thereby forming a light-shielding film pattern 30a (see FIGS. 3, (e) and (f)). A mixed gas of $SF_6$ and He was used as a dry etching gas.

Then, the remaining resist pattern was stripped, thereby obtaining a binary mask of Comparative Example 3 (see FIG. 3, (g)).

There was almost no change in optical density (OD) of the light-shielding film at the wavelength 193 nm of ArF excimer laser exposure light as compared with that at the time of the manufacture of the mask blank.

Then, ArF excimer laser light with a pulse frequency of 300 Hz and a pulse energy of 16 mJ/cm$^2$/pulse was continuously irradiated onto the obtained binary mask so that the cumulative dose became 30 kJ/cm$^2$. Herein, the dose of 30 kJ/cm$^2$ corresponds to a dose which is received by a transfer mask when exposing/transferring a transfer pattern to resist films of 112,500 wafers.

The optical density (OD) of the light-shielding film after the irradiation was measured. As a result, it was less than 3.0 at the wavelength 193 nm of ArF excimer laser exposure light and thus a reduction in optical density was observed. Further, as a result of observing in detail a cross-section of the light-shielding film pattern using STEM, a modified layer was confirmed and an increase in line width (CD change) due to the modified layer was also confirmed to be 15 nm.

Further, like in Example 1, the obtained masks were immersed in an ammonia hydrogen peroxide mixture and hot water, respectively, thereby examining the chemical resistance (ammonia hydrogen peroxide mixture resistance and hot water resistance) thereof, particularly the chemical resistance of a pattern sidewall. As a result, corrosion of the pattern sidewall was confirmed in both cases.

Further, as a result of observing in detail a mask surface after the irradiation, deposits were confirmed on the glass substrate or the film due to precipitation of Mo.

Example 7

Manufacture of Mask Blank

Heat Treatment

On a substrate 1 made of synthetic quartz and having a size of about 152 mm×152 mm square and a thickness of 6.35 mm, a Ta nitride layer 2 was deposited to a thickness of 42 nm by the use of a DC magnetron sputtering apparatus. Deposition of the Ta nitride layer 2 was carried out by reactive sputtering by using Ta as a sputter target in a mixed gas atmosphere of Xe and $N_2$ (see FIG. 3(a)). Next, a Ta oxide layer 3 was deposited to a thickness of 9 nm onto the Ta nitride layer 2 while the substrate 1 with the Ta nitride layer 2 deposited thereon was held in the sputtering apparatus. Deposition of the Ta oxide layer 3 was performed by reactive sputtering by using Ta as a sputter target in a mixed gas atmosphere of Ar and $O_2$ (see FIG. 3(b)).

Thus, a light-shielding film 30 comprising the Ta nitride layer 2 and the Ta oxide layer 3 was formed on the substrate 1. At a surface of the light-shielding film 30, the reflectance (front-surface reflectance) for ArF exposure light (wavelength: 193 nm) was 24.8%. At a back surface of the substrate 1 without the light-shielding film 30, the reflectance (back-surface reflectance) for ArF exposure light was 37.8%. The transmittance for ArF exposure light was 0.1%. The light-shielding film 30 was subjected to AES (Auger Electron Spectroscopy) analysis. As a result, the content of nitrogen (N) in the Ta nitride layer 2 was 16 at % and the content of oxygen (O) in the Ta oxide layer 3 was 58 at %. Subsequently, before progress of natural oxidation (for example, within one hour after the film deposition) or after the mask blank after deposition of the light-shielding film 30 was held in an environment without causing natural oxidization to progress, the mask blank thus manufactured was subjected to a heat treatment (surface treatment) in the ambient atmosphere at a heating temperature of 200° C. for a treating time of 5 minutes.

Figure 11:
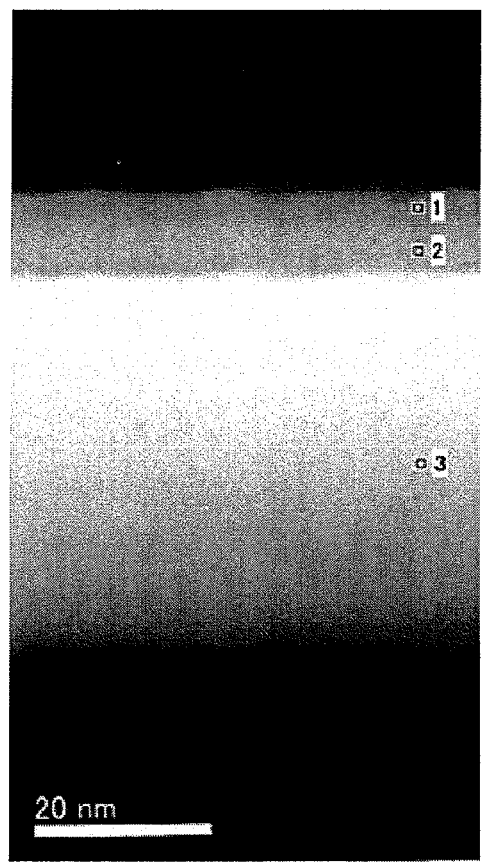
FIG. 11 is a dark-field (DF) STEM image which shows a cross-section of a light-shielding film in a mask blank according to Example 7.
Figure 12:
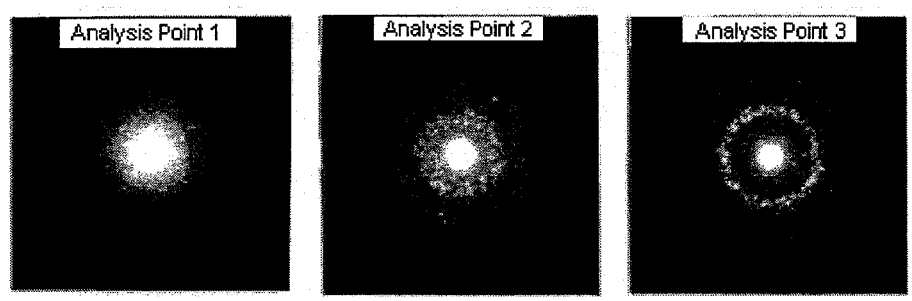
FIG. 12 shows an electron diffraction image of each area of the light-shielding film in the mask blank according to Example 7.

The mask blank thus manufactured was subjected to cross-sectional observation by the use of a STEM (Scanning Transmission Electron Microscope). FIG. 11 shows a dark-field (DF) image of the light-shielding film 30, taken by the STEM. From the dark-field (DF) image, it has been confirmed that the light-shielding film 30 had a highly oxidized layer 4 of 3 nm thick as a surface layer. By using the specimen inspected by the STEM, an electron beam (a focused beam having a beam diameter of about 1 nm) was irradiated onto a surface of a sectional plane of the light-shielding film 30 from a direction perpendicular to the sectional plane to obtain electron diffraction images. FIG. 12 shows the electron diffraction images of an analysis point 1 (shown by "☐1" in FIG. 11), an analysis point 2 (shown by "☐2" in FIG. 11), and an analysis point 3 (shown by "☐3" in FIG. 11). It has been confirmed from the electron diffraction images that the analysis point 1 in a region of the highly oxidized layer 4 had an amorphous structure while the analysis point 2 in a region of the Ta oxide layer 3 had a mixed state of an amorphous structure and a microcrystalline structure. It has been also confirmed from the electron diffraction image that the analysis point 3 in a region of the Ta nitride layer 2 had a microcrystalline structure.

Figure 13:
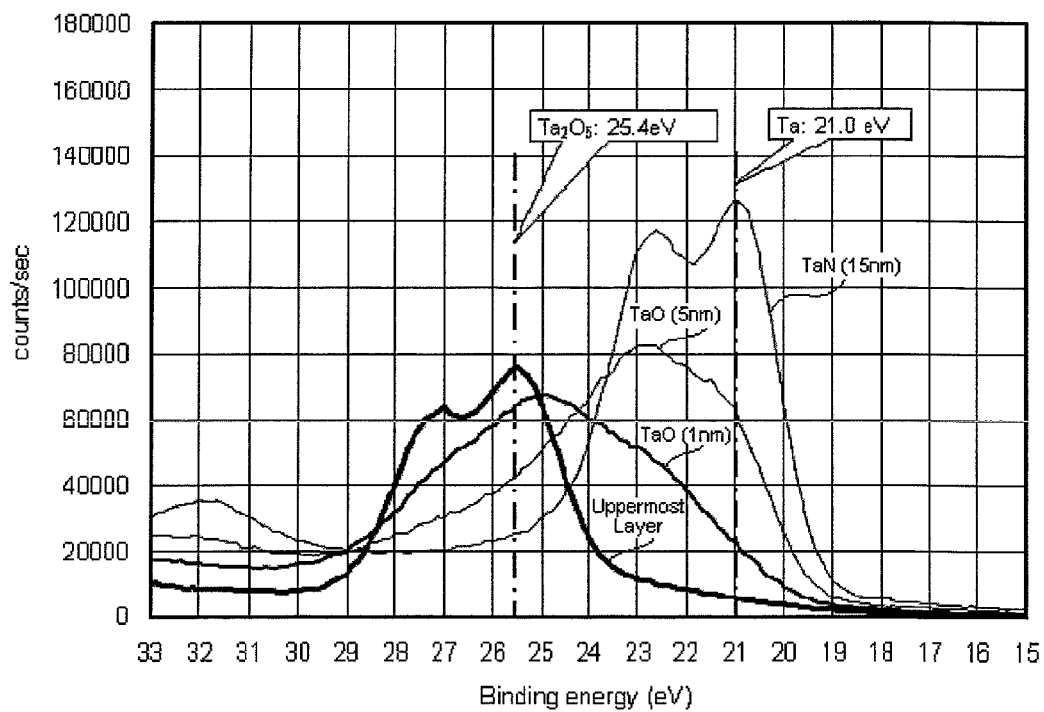
FIG. 13 shows Ta 4f narrow spectra as a result of XPS analysis of the light-shielding film in the mask blank according to Example 7.

Subsequently, the light-shielding film 30 was subjected to an XPS (X-ray Photoelectron Spectroscopy) analysis. FIG. 13 shows, as a result of the XPS analysis, Ta 4f narrow spectra of the light-shielding film 30. From the result shown in FIG. 13, it is seen that the narrow spectrum of an uppermost surface layer of the light-shielding film 30 has a high peak at a position of the binding energy (25.4 eV) of $T_2O_5$. Therefore, it is understood that the abundance ratio of $T_2O_5$ bonds is high in the uppermost layer. In the narrow spectrum of a layer (the region of the highly oxidized layer 4) placed at the depth of 1 nm from the surface of the light-shielding film 30, a single peak is observed at a glance. However, this spectrum was obtained as a result of superposition of a peak at a position of the binding energy (25.4 eV) of $Ta_2O_5$ and another peak at a position of the binding energy (21.0 eV) of Ta. The peak of the spectrum is considerably close to the position of the binding energy of $Ta_2O_5$. This shows that the abundance ratio of $Ta_2O_5$ bonds in this layer is high, although it is lower than that of $Ta_2O_5$ bonds in the uppermost surface layer.

On the other hand, in the narrow spectrum of a layer (the region of the Ta oxide layer 3) placed at the depth of 5 nm from the surface of the light-shielding film 30, a single peak is observed at a glance. Again, this spectrum was obtained as a result of superposition of a peak at a position of the binding energy (25.4 eV) of $Ta_2O_5$ and a peak at a position of the binding energy (21.0 eV) of Ta. However, the peak of the spectrum is slightly closer to the position of the binding energy of Ta and the abundance ratio of $Ta_2O_5$ bonds is not high in this layer. In addition, in the narrow spectrum of a layer (the region of the Ta nitride layer 2) placed at the depth of 15 nm from the surface of the light-shielding film 30, a peak is present near the position of the binding energy (21.0 eV) of Ta. This suggests that the Ta nitride layer has a nitrogen content of 16 at % and is relatively low in nitridation degree and the binding energy of the Ta nitride is close to the binding energy of Ta. This is obvious also from the fact that the binding energy of TaN (N:50 at %) is 23.0 eV and the binding energy of $Ta_2N$ (N:about 33 at %) is 22.6 eV and thus the binding energy becomes closer to the binding energy of Ta as the nitrogen content decreases.

As described above, it is understood from the result of the AES analysis for the light-shielding film 30 of Example 1 and the result of the XPS analysis for the light-shielding film 30 of Example 7 that, in the light-shielding film 30, each of the Ta oxide layer 3, the inside of the highly oxidized layer 4, and the uppermost layer of the highly oxidized layer 4 has the oxygen content of 60 at % or more and that the oxygen content in the light-shielding film 30 increases towards the surface. Furthermore, it is obvious that, towards the surface, the peak of the Ta 4f narrow spectrum is shifted to a higher energy side and the abundance ratio of the $Ta_2O_5$ bonds in the film becomes higher.

Examples 8 to 12

Manufacture of a Transfer Mask, Manufacture of a Semiconductor Device

Transfer masks according to Examples 8 to 12 were manufactured by the use of mask blanks obtained by depositing a light-shielding film 30 in a manner similar to that of Example 7 and carrying out a heat treatment (surface treatment) within the ambient atmosphere at a heating temperature of 200° C. for a processing time of 5 minutes.

At first, an electron beam resist 5 was applied to each mask blank to a thickness of 100 nm (see FIG. 3(c)) and electron beam lithography and development were carried out to form a resist pattern 5a having a circuit pattern of DRAM hp45 nm (see FIG. 3(d)).

Next, dry etching was carried out by the use of a fluorine-based gas ($CF_4$ gas) to form a pattern 3a of a Ta oxide layer 3 (see FIG. 3(e)). Thereafter, dry etching was performed by the use of chlorine-based gas ($Cl_2$) to form a pattern 2a of the Ta nitride layer 2. Further, additional etching of 40% was conducted to form a light-shielding film pattern 30a on a substrate 1 (FIG. 3(f)).

Subsequently, the resist pattern 5a on the light-shielding film pattern 30a was removed. Thus, the light-shielding film pattern 30a having a function as a transfer mask was obtained (FIG. 3(g)).

As described above, the plural transfer masks (binary masks) were manufactured.

Then, the transfer mask manufactured as mentioned above was subjected to a hot water treatment (surface treatment) like in Example 2 to obtain a transfer mask according to Example 8. Another transfer mask manufactured as mentioned above was subjected to an ozone treatment like in Example 3 to obtain a transfer mask according to Example 9. Still another transfer mask manufactured as mentioned above was subjected to a heat treatment like in Example 4 to obtain a transfer mask according to Example 10. Yet another transfer mask manufactured as mentioned above was subjected to an ultraviolet irradiation treatment like in Example 5 to obtain a transfer mask according to Example 11. Yet still another transfer mask manufactured as mentioned above was subjected an oxygen plasma treatment like in Example 6 to obtain a transfer mask according to Example 12.

For each of the transfer masks thus manufactured according to Examples 8 to 12, it has been confirmed that highly oxidized layers 4a, 4b, and 4c of tantalum (Ta) were formed as a surface layer of the light-shielding film pattern 30a. Specifically, the highly oxidized layers 4a, 4b, and 4c of 3 nm thick were confirmed by cross-sectional observation conducted by a STEM (Scanning Transmission Electron Microscope). The light-shielding film pattern 30a was subjected to AES (Auger Electron Spectroscopy) analysis at a portion where the light-shielding film was left. As a result of the analysis, a profile of the light-shielding film in a depth direction was obtained. From the profile, it has been confirmed that the highly oxidized layer 4a of tantalum as a surface layer of the Ta oxide layer 3 had the oxygen content of 71.4 to 67 at % Furthermore, a side wall portion of the light-shielding film pattern 30a was subjected to EDX (Energy Dispersive X-ray spectroscopy) analysis during observation by the STEM. The result of the EDX analysis was compared with the result of the previously-conducted AES analysis for the highly oxidized layer 4a as the surface layer of the light-shielding film pattern 30a. As a consequence, it has been confirmed that the oxygen content of the highly oxidized layer 4a was equal to those of the highly oxidized layers 4b and 4c.

Furthermore, the light-shielding film pattern 30a of each of the transfer masks according to Examples 8 to 12 was subjected to XPS (X-ray Photoelectron Spectroscopy) analysis in a manner similar to that conducted for the mask blanks. Specifically, Ta 4f narrow spectra were acquired for the highly oxidized layer 4a, the pattern 3a of the Ta oxide layer 3, and the pattern 2a of the Ta nitride layer 2, respectively, and compared with one another. As a result, it has been confirmed that the pattern 3a of the Ta oxide layer 3 and the highly oxidized layer 4a had the oxygen content of 60 at % or more and that the oxygen content in the light-shielding film pattern 30a increased towards the surface. In addition, it has been confirmed that, towards the surface of the light-shielding film pattern 30a, the peak of the Ta 4f narrow spectrum was shifted to a higher energy side and the abundance ratio of the $Ta_2O_5$ bonds in the film become high.

By using each of the transfer masks according to Examples 8 to 12 manufactured in the similar manner, an exposure transfer step was carried out to transfer a transfer pattern onto a transfer object, that is, a resist film formed on a semiconductor wafer. As an exposure apparatus, use was made of an immersion exposure type using annular illumination with an ArF excimer laser as a light source. Specifically, each of the transfer masks according to Examples 8 to 12 was set on a mask stage of the exposure apparatus. For a resist film formed on each semiconductor wafer and adapted for ArF immersion exposure, exposure transfer was performed. Each resist film after exposure was subjected to a predetermined development process to form a resist pattern. Thereafter, by the use of each resist pattern, a circuit pattern of DRAM hp45 nm was formed on each semiconductor wafer.

For the circuit pattern on each semiconductor wafer, cross-sectional observation was performed by using the STEM (Scanning Transmission Electron Microscope). As a consequence, it was confirmed that each semiconductor wafer subjected to exposure transfer by using each of the transfer masks of Examples 8 to 12 sufficiently satisfied the specification of the circuit pattern of DRAM hp45 nm.

Example 13

Manufacture of a Mask Blank

Heat Treatment

On a substrate 1 made of synthetic quartz and having a size of about 152 mm×152 mm square and a thickness of 6.35 mm, a TaBN layer (light-shielding layer) 2 was deposited to a thickness of 47 nm by a DC magnetron sputter apparatus. Deposition of the TaBN layer 2 was performed by reactive sputtering using, as a sputter target, a mixed target of Ta and B (Ta:B=80:20 in at % ratio) in a mixed gas atmosphere of Xe and $N_2$ (see FIG. 3(a)). Next, in a state where the substrate 1 with the TaBN layer 2 deposited thereon was held in the sputter apparatus, a TaBO layer (front-surface antireflection layer) 3 was deposited to a thickness of 10 nm. Deposition of the TaBO layer 3 was performed by reactive sputtering using a mixed target of Ta and B in a mixed atmosphere of Ar and $O_2$ (see FIG. 3(b)).

Figure 14:
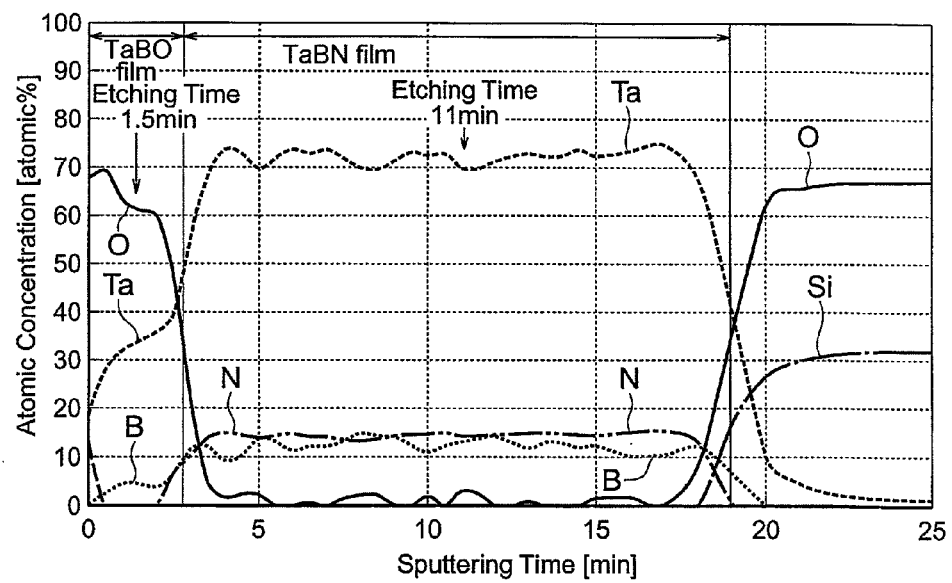
FIG. 14 shows a result (depth profile) of XPS analysis of a light-shielding film of Example 13 which is formed by a TaBO layer and a TaBN layer.

Thus, a light-shielding film 30 comprising the TaBN layer 2 and the TaBO layer 3 was formed on the substrate 1. At a surface of the light-shielding film 30 manufactured as described above, the reflectance (front-surface reflectance) was 18.5% for ArF exposure light (wavelength of 193 nm). At a back surface of the substrate 1 without the light-shielding film 30, the reflectance (back-surface reflectance) was 33.9% for ArF exposure light. The transmittance for ArF exposure light was 0.1%. The light-shielding film 30 was subjected to XPS (X-ray Photoelectron Spectroscopy) analysis. As a result, the TaBN layer 2 had a nitrogen content of 15 at %. The TaBO layer 3 had an oxygen content of 61 at %. FIG. 14 shows, as a result of XPS (X-ray Photoelectron Spectroscopy) analysis, a profile of the light-shielding film 30 in a depth direction. Subsequently, before progress of natural oxidation (for example, within one hour after the film deposition) or after the mask blank after deposition of the light-shielding film 30 was held in an environment without causing natural oxidization to progress, the mask blank thus manufactured was subjected to a heat treatment (surface treatment) in the ambient atmosphere at a heating temperature of 200° C. for a treating time of 5 minutes. The mask blank thus manufactured was subjected to cross-sectional observation by the use of the STEM (Scanning Transmission Electron Microscope). As a result, it has been confirmed from dark-field images that the light-shielding film 30 had a highly oxidized layer 4 of 3 nm thick as a surface layer.

Figure 15:
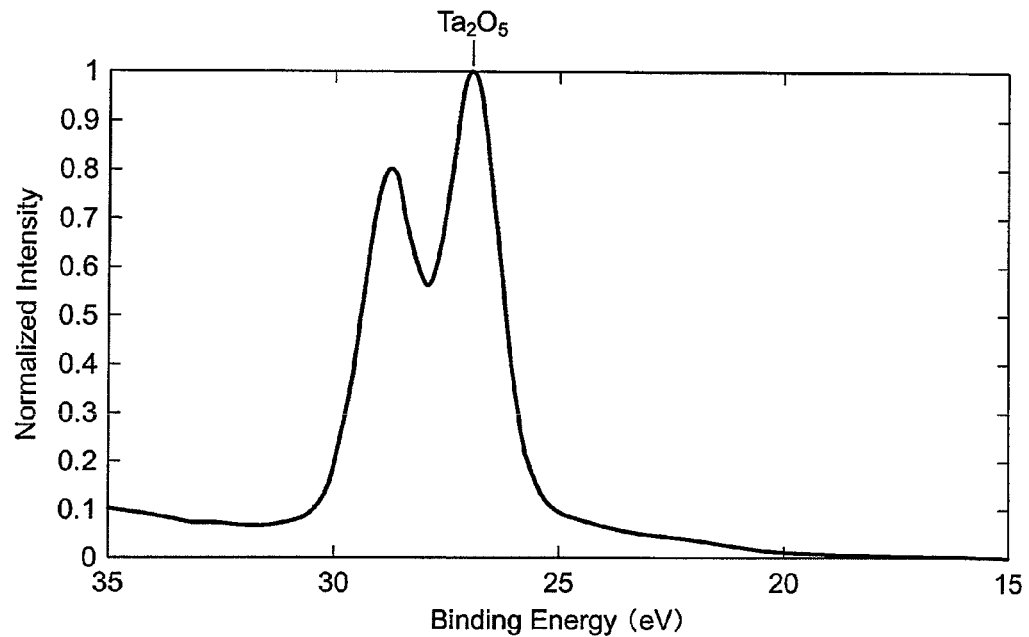
FIG. 15 shows, as a result of XPS analysis of a light-shielding film in a mask blank according to Example 13, a Ta 4f narrow spectrum of a highly oxidized layer 4.
Figure 16:
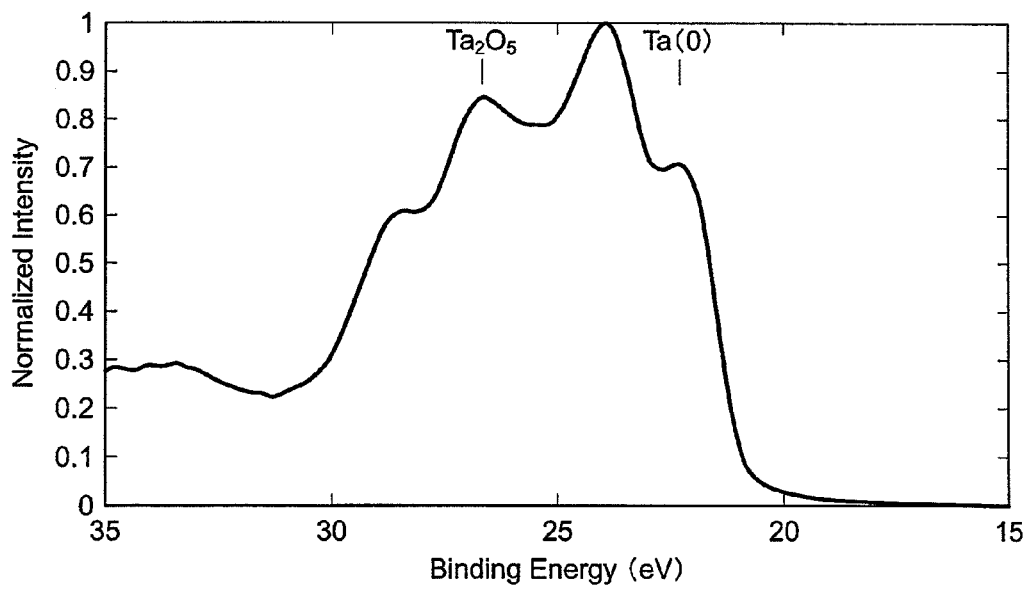
FIG. 16 shows, as a result of XPS analysis of the light-shielding film of the mask blank according to Example 13, a Ta 4f narrow spectrum of a TaBO layer 3.
Figure 17:
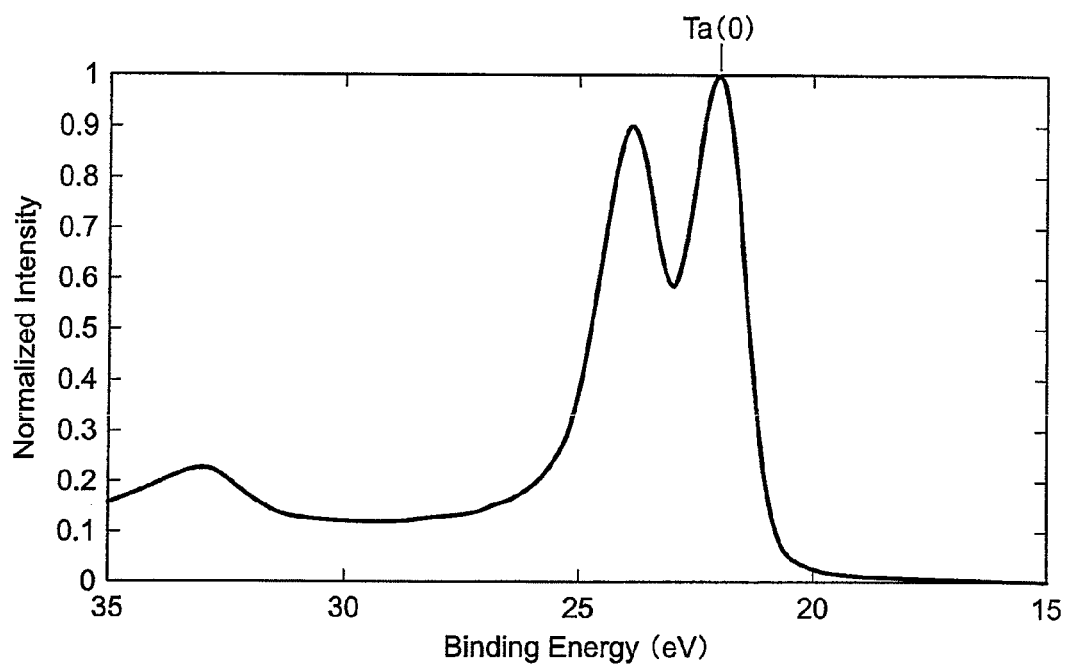
FIG. 17 shows, as a result of XPS analysis of the light-shielding film of the mask blank according to Example 13, a Ta 4f narrow spectrum of a TaBN layer 2.

FIGS. 15 to 17 show Ta 4f narrow spectra of the light-shielding film 30 as a result of the XPS analysis. FIG. 15 shows the Ta 4f narrow spectrum of an uppermost layer of the light-shielding film 30. It is seen that the narrow spectrum of the uppermost layer (highly oxidized layer 4) has a high peak at a position of the binding energy of $Ta_2O_5$. Therefore, it is understood that the abundance ratio of $Ta_2O_5$ bonds is high in the uppermost layer. FIG. 16 shows a Ta 4f narrow spectrum of the TaBO layer 3 at a depth reached by Ar ion etching of the light-shielding film 30 from its surface in a depth direction for 1.5 minutes (see FIG. 14). In the narrow spectrum of the TaBO layer 3, a peak appearing at a position of the binding energy of $Ta_2O_5$ is superposed on another peak appearing at a position of the binding energy of Ta. As compared with the narrow spectrum of the uppermost layer, the narrow spectrum of the TaOB layer 3 has the peak slightly closer to the position of the binding energy of Ta and the abundance ratio of $Ta_2O_5$ bonds in the TaBO layer is not high. FIG. 17 shows a Ta 4f narrow spectrum of the TaBN layer 2 at a depth reached by Ar ion etching of the light-shielding film 30 from its surface in a depth direction for 11 minutes (see FIG. 14). The narrow spectrum of the TaBN layer 2 does not have a peak at a position of the binding energy of $Ta_2O_5$ but has a peak near the position of the binding energy (21.0 eV) of Ta.

As described above, it is understood from the result of the XPS analysis for the light-shielding film 30 of Example 13 that, even in the light-shielding film 30 containing boron, each of the TaBO layer 3 and the uppermost layer of the highly oxidized layer 4 has the oxygen content of 60 at % or more and that the oxygen content in the light-shielding film 30 increases towards the surface. Furthermore, it is obvious that, towards the surface, the peak of the Ta 4f narrow spectrum is shifted to a high energy side and the abundance ratio of the $Ta_2O_5$ bonds in the film becomes higher.

What is claimed is:

1. A mask blank for manufacturing a transfer mask, the mask blank having a light-shielding film on a transparent substrate,
    wherein the light-shielding film:
    (a) is made of a material containing tantalum as a main metal component,
    (b) has a highly oxidized layer formed as a surface layer of the light-shielding film, that is placed on a side opposite to a transparent substrate side, and
    (c) the highly oxidized layer has a Ta 4f narrow spectrum, when the highly oxidized layer is analyzed by X-ray photoelectron spectroscopy, and has a maximum peak at a binding energy of more than 23 eV.

2. The mask blank according to claim 1, wherein the oxygen content of the highly oxidized layer is 68 at % or more.

3. The mask blank according to claim 1, wherein the highly oxidized layer has a thickness of 1.5 nm or more and 4 nm or less.

4. The mask blank according to any one of claims 1 to 3, wherein the highly oxidized layer has $Ta_2O_5$ bonds at an abundance ratio which is higher than that of $Ta_2O_5$ bonds in the light-shielding film except the highly oxidized layer.

5. The mask blank according to claim 1, wherein the light-shielding film is made of a material further containing nitrogen.

6. The mask blank according to claim 1, wherein the light-shielding film has a structure in which at least a light-shielding layer and a front-surface antireflection layer are laminated in this order from the transparent substrate side, and
the highly oxidized layer is formed as a surface layer of the front-surface antireflection layer, that is placed on a side opposite to a light-shielding layer side.

7. The mask blank according to claim 6, wherein an oxygen content of the front-surface antireflection layer is lower than the oxygen content of the highly oxidized layer.

8. The mask blank according to claim 7, wherein the oxygen content of the front-surface antireflection layer is 50 at % or more.

9. The mask blank according to any one of claims 6 to 8, wherein the highly oxidized layer has $Ta_2O_5$ bonds at an abundance ratio which is higher than that of $Ta_2O_5$ bonds in the front-surface antireflection layer.

10. The mask blank according to claim 6, wherein the light-shielding layer is made of a material further containing nitrogen.

11. The mask blank according to claim 1, wherein the light-shielding film has a thickness of less than 60 nm.

12. The mask blank according to claim 1, wherein a Ta 4f narrow spectrum of the light-shielding film, except the highly oxidized layer analyzed by X-ray photoelectron spectroscopy, has a maximum peak at a binding energy which is equal to or less than 23 eV.

13. A transfer mask having a light-shielding film pattern on a transparent substrate,
wherein the light-shielding film pattern is made of a material containing tantalum as a main metal component,
wherein a highly oxidized layer is formed as a surface layer of the light-shielding film pattern, that is placed on a side opposite to a transparent substrate side and as a surface layer of a sidewall of the light-shielding film pattern, and
wherein the highly oxidized layer has a Ta 4f narrow spectrum, when the highly oxidized layer is analyzed by X-ray photoelectron spectroscopy, and has a maximum peak at a binding energy of more than 23 eV.

14. The transfer mask according to claim 13, wherein the oxygen content of the highly oxidized layer is 68 at % or more.

15. The transfer mask according to claim 13, wherein the highly oxidized layer has a thickness of 1.5 nm or more and 4 nm or less.

16. The transfer mask according to any one of claims 13 to 15, wherein the highly oxidized layer has $Ta_2O_5$ bonds at an abundance ratio which is higher than that of $Ta_2O_5$ bonds in the light-shielding film pattern except the highly oxidized layer.

17. The transfer mask according to claim 13, wherein the light-shielding film pattern is made of a material further containing nitrogen.

18. The transfer mask according to claim 13, wherein the light-shielding film pattern has a structure in which at least a light-shielding layer and a front-surface antireflection layer are laminated in this order from the transparent substrate side.

19. The transfer mask according to claim 18, wherein an oxygen content of the front-surface antireflection layer is lower than the oxygen content of the highly oxidized layer.

20. The transfer mask according to claim 19, wherein the oxygen content of the front-surface antireflection layer is 50 at % or more.

21. The transfer mask according to any one of claims 18 to 20, wherein the highly oxidized layer has $Ta_2O_5$ bonds at an abundance ratio which is higher than that of $Ta_2O_5$ bonds in the front-surface antireflection layer.

22. The transfer mask according to claim 18, wherein the light-shielding layer is made of a material further containing nitrogen.

23. The transfer mask according to claim 13, wherein the light-shielding film pattern has a thickness of less than 60 nm.

24. A method of manufacturing a semiconductor device, comprising forming a circuit pattern on a semiconductor wafer by the use of the transfer mask according to claim 13.

25. The transfer mask according to claim 13, wherein a Ta 4f narrow spectrum of the light-shielding film pattern, except the highly oxidized layer analyzed by X-ray photoelectron spectroscopy, has a maximum peak at a binding energy which is equal to or less than 23 eV.

* * * * *